(12) United States Patent
Wile

(10) Patent No.: US 6,798,250 B1
(45) Date of Patent: Sep. 28, 2004

(54) CURRENT SENSE AMPLIFIER CIRCUIT

(75) Inventor: Donald T. Wile, San Jose, CA (US)

(73) Assignee: Pixim, Inc., Mountain View, CA (US)

( * ) Notice: Subject to any disclaimer, the term of this patent is extended or adjusted under 35 U.S.C. 154(b) by 0 days.

(21) Appl. No.: 10/650,345

(22) Filed: Aug. 27, 2003

Related U.S. Application Data

(60) Provisional application No. 60/408,499, filed on Sep. 4, 2002.

(51) Int. Cl.[7] .............................................. G01R 19/00
(52) U.S. Cl. ........................................... 327/51; 327/53
(58) Field of Search ...................................... 327/51–57

(56) References Cited

U.S. PATENT DOCUMENTS 6,614,272 B1 * 9/2003 Hayashi ....................... 327/77

* cited by examiner

*Primary Examiner*—Kenneth B. Wells
(74) *Attorney, Agent, or Firm*—Patent Law Group LLP; Carmen C. Cook

(57) ABSTRACT

A current sense amplifier circuit for detecting a first current includes an input gain stage incorporating a feedback loop, a current mirror, a charge integration stage and a comparator. The first current is coupled to an input node of the input gain stage where the input gain stage operates to maintain the voltage at the input node at a substantially constant level. The current mirror is coupled to mirror the first current into a second current. The charge integration stage is coupled to integrate charge associated with the second current to develop a first voltage. The comparator is coupled to compare the first voltage to a reference level and providing an output signal. The comparator generates an output signal having a first value when the first current exceeds a predetermined threshold level and a second value when the first current is less than the predetermined threshold level.

41 Claims, 10 Drawing Sheets

FIG. 9B
FIG. 9A

CURRENT SENSE AMPLIFIER CIRCUIT

CROSS REFERENCE TO RELATED APPLICATION

This application claims the benefit of U.S. Provisional Patent Application Ser. No. 60/408,499, filed Sep. 4, 2002, entitled "Digital Pixel Systems," of Donald T. Wile et al., which application is incorporated herein by reference in its entirety.

FIELD OF THE INVENTION

The invention relates to sense amplifier circuits and, in particular, to current sense amplifier circuits for sensing current change on a signal line.

DESCRIPTION OF THE RELATED ART

A CMOS image sensor with pixel level analog-to-digital conversion is described in U.S. Pat. No. 5,461,425 of B. Fowler et al. (the '425 patent). Such an image sensor, referred to as a digital pixel sensor (DPS), provides a digital output signal at each pixel element representing the light intensity detected by that pixel element. The combination of a photodetector and an analog-to-digital (A/D) converter in an area image sensor helps enhance detection accuracy, reduce power consumption, and improves overall system performance.

One of the components in a DPS system is analog circuitry used to convert the photodetector voltage to a digital value. The analog circuitry is sensitive to the noise that digital signals can generate as the digital signal changes state. The amount of noise generated by a digital signal is a direct function of the voltage swing of the signal. One of the noisier digital signals in a DPS system is the bit line read out. In conventional image sensors including a two dimensional array of pixel elements, a bit line is coupled to a column of pixel elements to read out the digital value from a selected pixel element. The bit lines are typically precharged to a predetermined voltage and the bit line voltage is forced to a second voltage level depending on the digital value of the cell to be read out. A sense amplifier coupled to the bit line detects the change in voltage to determine the logical value of the bit line voltage. Thus, the bit line signal is typically associated with a large voltage swing, introducing undesirable noise to the image sensor.

Therefore, rather than sensing a voltage transition on the bit line, it is desirable to sense a current transition on the bit line while holding the bit line voltage at a constant. By holding the bit line voltage constant, noise within an image sensor associated with bit line voltage swing can be minimized. When current sensing is employed, the logical state of the bit line readout is determined either by the presence (digital 1) or lack (digital 0) of bit line current. To facilitate bit line current sensing, a current mode sense amplifier, or current sense amplifier, is needed.

FIG. 1 is a circuit diagram of a conventional current sense amplifier. Current sense amplifier 10 includes a high speed differential input operational amplifier configured as an integrator. That is, an integrating capacitor Cinteg is coupled across the output terminal and the negative input terminal of the operational amplifier. The integrator is reset at the beginning of each clock cycle with a short pulse. Specifically, a pulse generated by the pulse generator causes a transistor 12 to turn on to discharge capacitor Cinteg. In operation, the bit line current, if present, will charge up capacitor Cinteg. If the output of the integrator exceeds the logic threshold of the D-input to the flip flop before the next clock edge, a logical "1" is asserted at the output of the flip flop, otherwise a logical "0" is asserted. The positive input of the operational amplifier is held at a reference voltage Vr sufficiently large to insure a minimum bit line current. However, the reference voltage Vr must also be sufficiently small to guarantee that it is below the logic low input threshold of the flip flop. Thus, a complicated biasing scheme is required to guarantee all the operation conditions.

Current sense amplifier 10 of FIG. 1 will hold the bit line voltage at a constant as long as the output of the operational amplifier is free to move (that is, not limited by the power supply rail) and as long as the operational amplifier is not slew rate or band limited. These are all difficult requirements to meet and thus the current sense amplifier circuit shown in FIG. 1 usually cannot hold the bit line voltage constant within a reasonable range.

Conventional current sense amplifiers are not satisfactory because they typically are not capable of holding the bit line voltage constant within a reasonable range. When the circuit in FIG. 1 is used, a complicated differential operational amplifier is needed.

It is therefore desirable to provide a current sense amplifier for performing bit line current sensing that can be implemented using relatively simple circuitry and can hold the bit line voltage constant without limitations.

SUMMARY OF THE INVENTION

According to one embodiment of the present invention, a current sense amplifier circuit coupled to detect a first current flowing in a first node includes an input gain stage incorporating a feedback loop, a current mirror, a charge integration stage and a comparator. The first current is coupled to an input node of the input gain stage where the input gain stage operates to maintain the voltage at the input node at a substantially constant level. The current mirror is coupled to an output node of the input gain stage to mirror the first current into a second current. The charge integration stage is coupled to integrate charge associated with the second current to develop a first voltage. Finally, the comparator is coupled to compare the first voltage to a reference level and providing an output signal at an output terminal. In operation, the comparator generates an output signal having a first value when the first current exceeds a predetermined threshold level and a second value when the first current is less than the predetermined threshold level. In one embodiment, the comparator is implemented as a Schmitt trigger.

The present invention is better understood upon consideration of the detailed description below and the accompanying drawings.

BRIEF DESCRIPTION OF THE DRAWINGS

FIGS. 9A and 9B are circuit diagrams of a current mirror used in the current sense amplifier of FIG. 7 and a current mirror used in the current sense amplifier of FIG. 8.

DETAILED DESCRIPTION OF THE PREFERRED EMBODIMENTS

In accordance with the principles of the present invention, a current sense amplifier includes an input gain stage coupled to receive an input current to be sensed at an input node, a current mirror to mirror the input current to an integrating current and an integrating stage to integrate charge associated with the integrating current. As a result of the charge integration, a voltage is developed which voltage is compared with a reference voltage to determine if the input current exceeds a predetermined current sense threshold level. The current sense amplifier provides an output signal having a value indicative of whether the input current is less than or exceeds the predetermined current threshold level. In the current sense amplifier of the present invention, the input gain stage incorporates a unity gain feedback loop to maintain the voltage at the input node at a substantially constant level.

The current sense amplifier of the present invention is capable of maintaining a constant voltage at the input node over a large range of operating conditions. The current sense amplifier of the present invention is suitable for use in a data cell array including circuitry that is susceptible to noise corruption. For example, the current sense amplifier of the present invention has particular application in a digital pixel sensor for performing bit line current sensing. By holding the bit line voltage constant, significant noise reduction can be realized to enable the digital pixel sensor to operate at a high level of accuracy.

Figure 1:
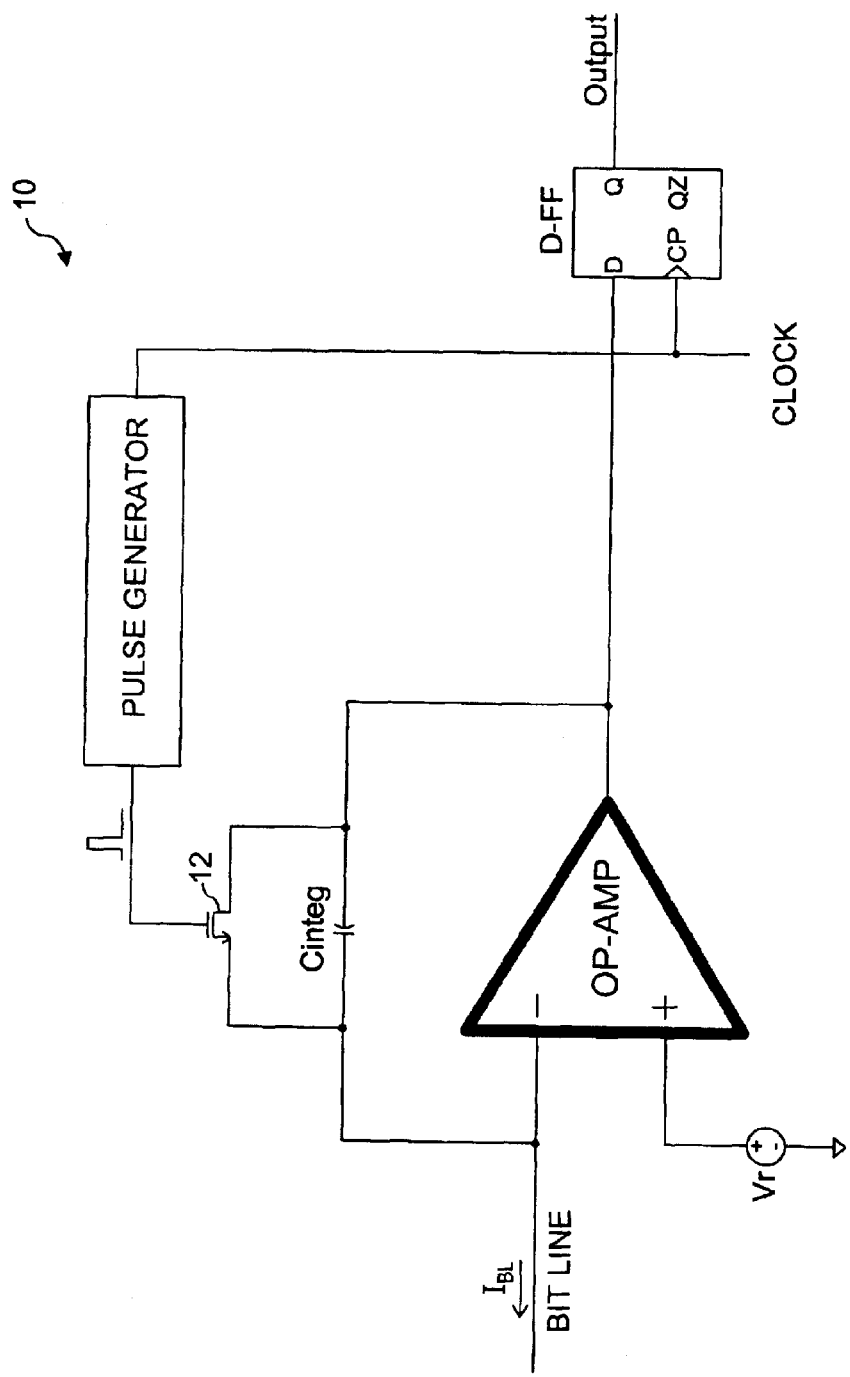
FIG. 1 is a circuit diagram of a conventional current sense amplifier.
Figure 2:
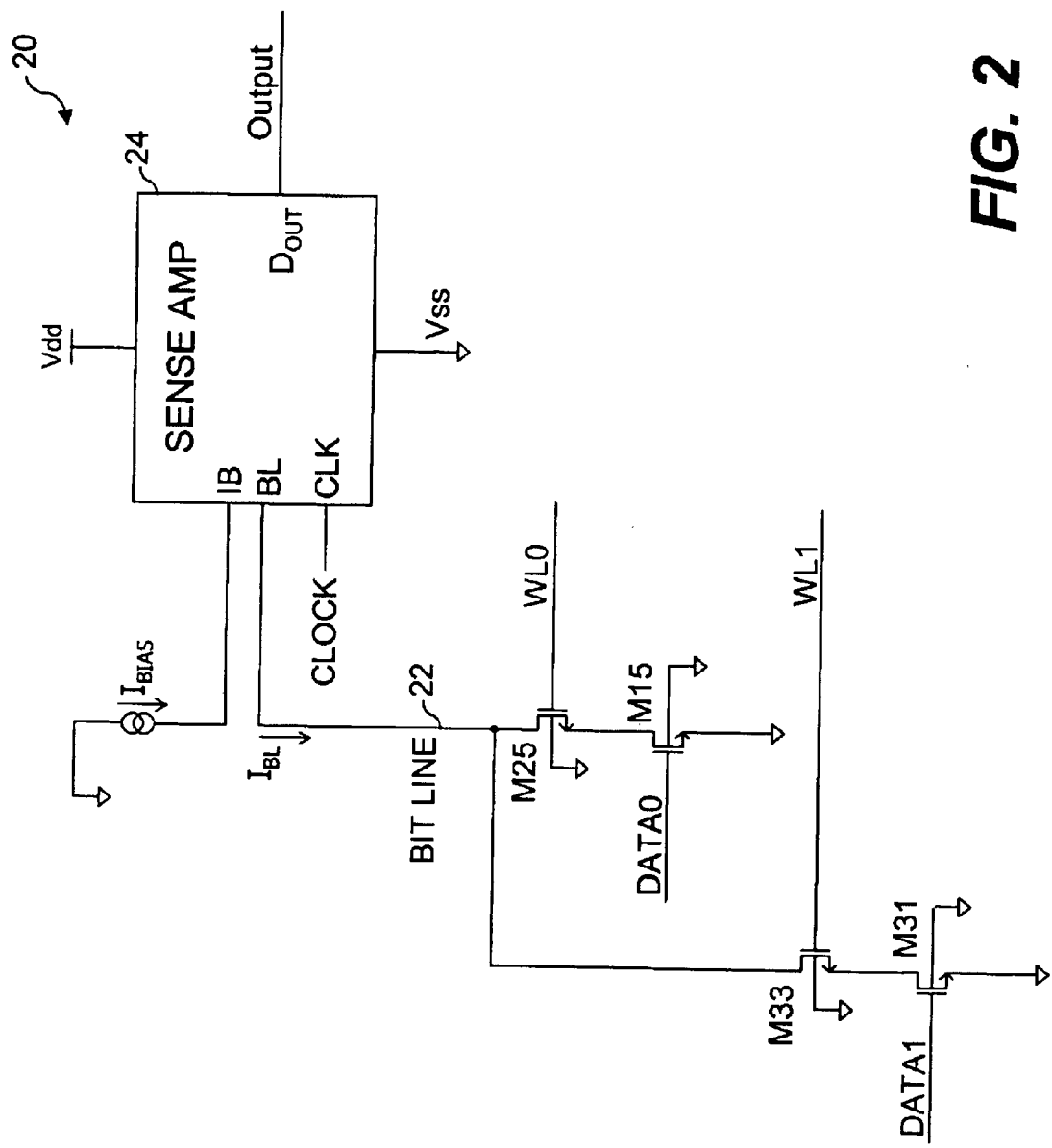
FIG. 2 is a schematic diagram of a bit line read out system and illustrates the incorporation of a current sense amplifier of the present invention for sensing bit line current on a bit line.

FIG. 2 is a schematic diagram of a bit line read out system 20 and illustrates the incorporation of a current sense amplifier 24 of the present invention for sensing bit line current on a bit line. Referring to FIG. 2, current sense amplifier 24 is coupled to a bit line 22 to detect changes in the bit line current $I_{BL}$. Current sense amplifier 24 receives a bias current $I_{BIAS}$ and a clock signal CLOCK as inputs and generates an output signal $D_{OUT}$ as output. The clock signal CLOCK driving current sense amplifier 24 is used to synchronize the operation of the current sense amplifier with the read out system in which current sense amplifier is being applied.

In an array of data cells, such as in a memory array or in an image sensor including an array of pixel elements, each column of cells is coupled to a bit line for reading out the data values associated with the column of cells. Thus, in the present description, a column of cells can be a column of pixel elements in an image sensor array or it can be a column of memory cells in a memory array. A current sense amplifier according to the present invention is coupled to each bit line in an array for sensing the DATA values being read by the bit line.

In the present illustration, bit line 22 is coupled to read out "DATA" values from a column of cells. In FIG. 2, DATA values from two cells, DATA0 and DATA1, are coupled to bit line 22. Thus, bit line read out system 20 illustrates a column slice of a two row array. Of course, this is illustrative only and in most implementation, a data cell array typically includes a large number of rows coupled to the same bit line. DATA0 and DATA1, to be read out by sense amplifier 24, appear at the gate terminals of NMOS transistors M15 and M31. Transistors M15 and M31 and their associated pass transistors M25 and M33 are typically embedded in the data cell array. When a particular cell is to be read, the word line (WL) signal (such as WL0 or WL1) associated with that cell is asserted. In operation, only one WL signal is asserted at a time for any given column of cells. With a particular word line is asserted, a current from the selected transistor M15 or M31 will flow through the respective pass transistor M25 or M33. However, the current will only flow if the DATA signal is high, turning on transistor M31 or M15. The current that is caused to flow in bit line 22 is referred to as the bit line current.

In a typical read out operation, the word line WL signal is asserted at the rising edge of the clock cycle defined by the CLOCK signal. Current sense amplifier 24 is reset at the beginning of each clock cycle and detects the presence or lack of bit line current during the remainder of the clock cycle. If bit line current was present during a clock cycle, current sense amplifier 24 outputs a logic 1 as $D_{OUT}$ at the rising edge of the next clock cycle. If bit line current was absence during a clock cycle, current sense amplifier 24 outputs a logic 0 as $D_{OUT}$ at the rising edge of the next clock cycle.

Figure 3:
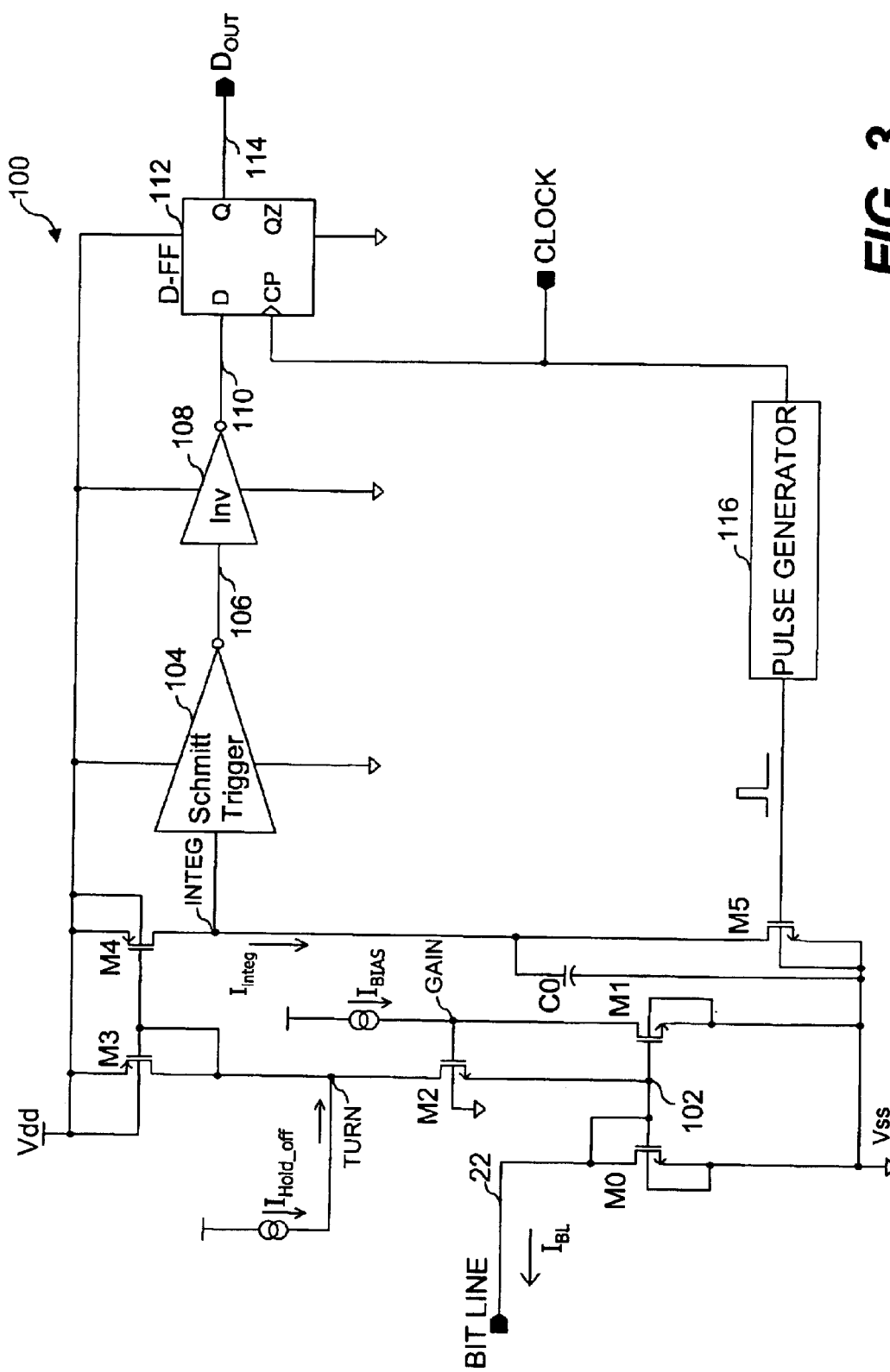
FIG. 3 is a schematic diagram of a current sense amplifier according to one embodiment of the present invention.

FIG. 3 is a schematic diagram of a current sense amplifier according to one embodiment of the present invention. Current sense amplifier 100 can be incorporated in bit line read out system 20 of FIG. 2 for detecting bit line current on bit line 22. Referring to FIG. 3, current sense amplifier 100 is coupled to bit line 22 to receive a bit line current input $I_{BL}$. Bit line current input $I_{BL}$ is connected to the gate terminal (input node 102) of an NMOS transistor M1 which is the input node of an input gain stage. The output of the input gain stage is the drain terminal of transistor M1 (node GAIN). The output of the input gain stage is fed back to the bit line input (input node 102) in a unity gain configuration by an NMOS transistor M2. This feedback forces input node 102 to look like a low impedance node, that is, to behave like a voltage source, within the bandwidth of the input gain stage.

The current that flows in transistor M1 is set by the feedback loop to equal bias current $I_{BIAS}$. In operation, the feedback loop will try to maintain the current in transistor M1 to equal bias current $I_{BIAS}$ independent of the bit line current $I_{BL}$ and independent of any current that may flow in transistor M0. As a result, the feedback loop will try and hold the voltage at input node 102 which is also the bit line voltage of bit line 22 at a constant. The ability to hold the bit line voltage constant over a wide range of operating conditions is a salient feature of the current sense amplifier of the present invention. In operation, should the bit line voltage try and decrease, the current though transistor M1 will try and decrease, resulting in an increase in the voltage at the drain terminal (the GAIN node) of transistor M1, which will cause transistor M2 to try and pull up the voltage at input node 102 to restore the original bit line voltage. The reverse applies when the bit line voltage tries and increases so that the feedback loop effectively maintains the bit line voltage at input node 102 at a constant value.

In current sense amplifier circuit 100, all of bit line current $I_{BL}$ will flow through transistor M2. Ignoring for the moment the current $I_{Hold\_off}$, bit line current $I_{BL}$ will flow through transistors M2 to a current mirror formed by PMOS transistors M3 and M4. Specifically, bit line current $I_{BL}$ flows through transistor M3 where the bit line current will be mirrored by transistor M4 and passed to an INTEG node as an integrating current $I_{Integ}$. The integrating current $I_{Integ}$ is used to charge a capacitor C0, causing the voltage at the INTEG node to rise. As a result, a voltage is developed at the INTEG node indicative of the amount of bit line current that is present at input node 102.

The INTEG node is coupled to a Schmitt trigger 104. In the present embodiment, Schmitt trigger 104 is implemented as an inverting stage. Thus, if the voltage at the INTEG node exceeds the trigger point of Schmitt trigger 104, the Schmitt trigger output (node 106) will go low. Otherwise, if the voltage at the INTEG node remains at below the trigger point of the Schmitt trigger, the Schmitt trigger output will remain at a high level. An inverter 108 is coupled to Schmitt trigger output node 106 to invert the output signal of Schmitt trigger 104. The trigger point of Schmitt trigger 104 in effect establishes a current sense threshold level for detecting the presence or absence of bit line current. One of ordinary skill in the art would appreciate that a Schmitt trigger has two threshold levels-one threshold level for the low-to-high transitions and another threshold level for the high-to-low transitions. In the present description, because the voltage of concern (the voltage at the INTEG node) is a voltage. that is being charged up from a low voltage level to a high voltage level, only the low-to-high transition threshold level of the Schmitt trigger is of interest. Therefore, in the present description, the trigger point of the Schmitt trigger is used to refer to the low-to-high transition threshold level of the Schmitt trigger. In other embodiments, a comparator can be used in place of the Schmitt trigger to compare the INTEG voltage with a reference level.

In accordance with the present invention, the current sense threshold level is the minimum amount of bit line current necessary for the current sense amplifier to detect the presence of bit line current. Bit line current is deemed present on a bit line when the bit line current exceeds the predetermined current sense threshold level and bit line current is deemed absent on a bit line when the bit line current is below the predetermined threshold level. When sufficient bit line current is present, the voltage at the INTEG node will up charged up to exceed the trigger point of Schmitt trigger 104. The output of Schmitt trigger 104 will be asserted and go low. Accordingly, the output of inverter 108 will go high (logical "1"). Thus, a logical "1" value at the output of inverter 108 is indicative of detection of bit line current that exceeds the predetermined threshold level. In the present description, reference to the "presence" or "absence" of bit line current refers to the detection of bit line current that exceeds or that is below the predetermined current sense threshold of the current sense amplifier.

The output (node 110) of inverter 108 is coupled to a D-flip flop (D-FF) 112. When inverter 108 drives the D-input of the DFF with a logical "1" value, the logical "1" value will be clocked out of D-flip flop 112 by the rising edge of the next clock cycle of the CLOCK signal. If inverter 108 drives the D-input of the D-FF with a logical "0" value, the logical "0" value will be clocked out of D-flip flop 112 by the rising edge of the next clock cycle of the CLOCK signal. As described above, the CLOCK signal driving current sense amplifier 100 is used to synchronize the operation of the current sense amplifier with the external system in which the current sense amplifier is incorporated. In the present embodiment, current sense amplifier 100 provides output data $D_{OUT}$ for the current clock cycle at the rising edge of the next clock cycle. In other embodiments, other timing schemes can be used.

The output signal of D-FF 112 on node 114 constitutes the output signal $D_{OUT}$ of current sense amplifier 100. Specifically, a logical "1" value at output $D_{OUT}$ indicates the presence of bit line current on bit line 22 while a logical "0" value at output $D_{OUT}$ indicates the detection of no bit line current on bit line 22.

In the present embodiment, due to the charge storage capability of capacitor C0, the INTEG node will stay high (or stay charged up) indefinitely even if bit line current $I_{BL}$ stops flowing. Consequently, capacitor C0 needs to be discharged to enable the detection of bit line current for the next clock cycle. In the present embodiment, capacitor C0 is discharged at the beginning of each clock cycle to enable the detection of bit line current for that clock cycle. Referring to FIG. 3, capacitor C0 is discharged by an NMOS transistor M5 controlled by a short reset pulse generated by a pulse generator 116. The short reset pulse turns on transistor M5 for a small fraction of time at the beginning of each clock cycle whereby transistor M5 shorts both plates of capacitor C0 to the ground or Vss node to remove all charge stored thereon. In one embodiment, pulse generator 116 provides a reset pulse having a pulse width that is 5 to 10% of the clock period of the CLOCK signal. For example, when the clock period is 10 ns, transistor M5 is turned on for 0.5 ns to discharge capacitor C0 to ground.

Figure 4:
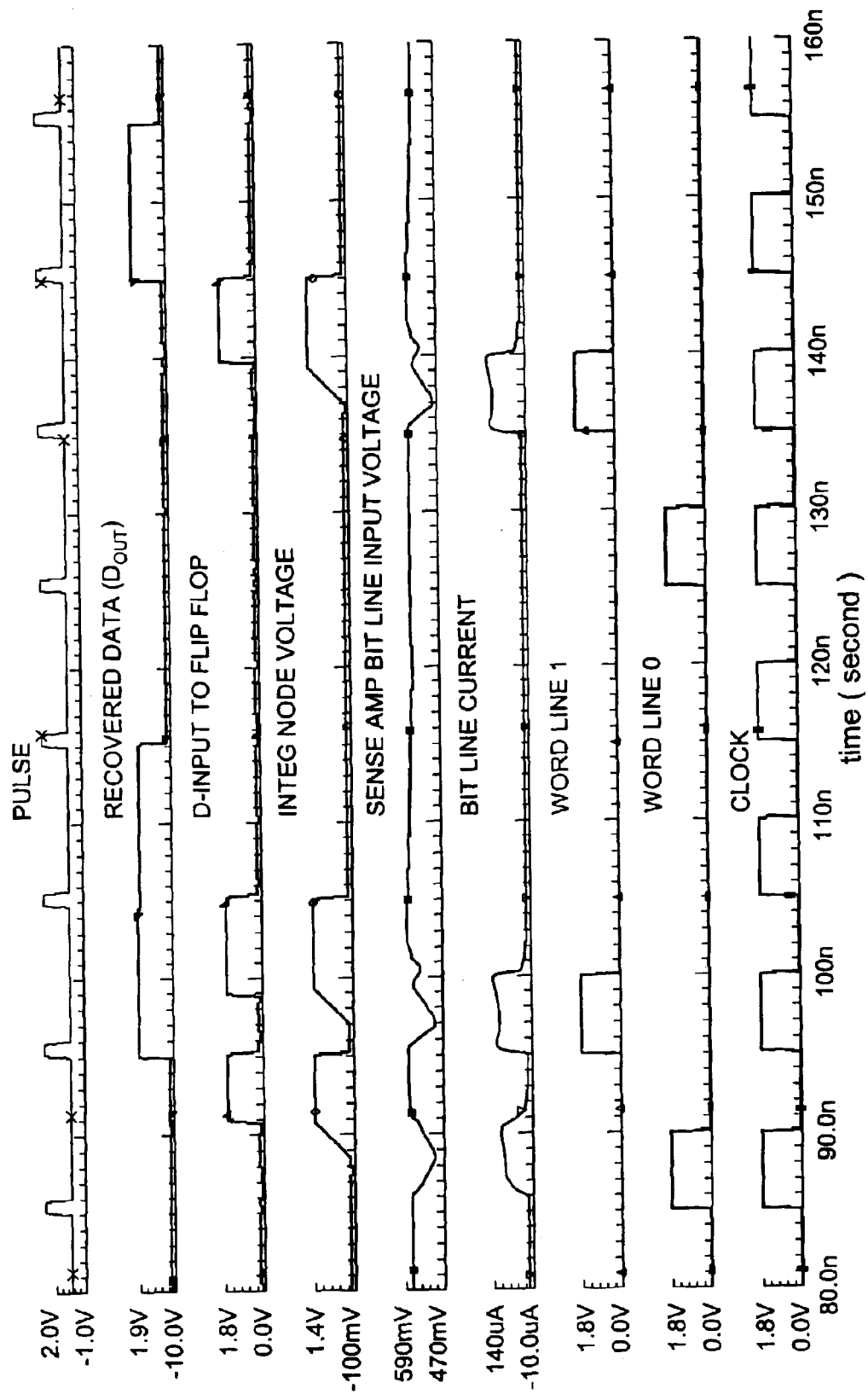
FIG. 4 is a timing level diagram illustrating the operation of the bit line read out system of FIG. 2 incorporating the current sense amplifier of FIG. 3 according to one embodiment of the present invention.

FIG. 4 is a timing level diagram illustrating the operation of the bit line read out system of FIG. 2 incorporating the current sense amplifier of FIG. 3 according to one embodiment of the present invention. FIG. 4 illustrates how the DATA values presented on the bit line as the presence or absence of bit line current is being accurately recovered by the current sense amplifier of the present invention. In the present illustration, the bit line read out system is being operated with a 100 MHz CLOCK signal. Thus, the CLOCK signal has a 10 ns clock period.

Referring to FIG. 4, at the rising edge of the first clock cycle, a reset pulse is asserted to discharge integrating capacitor C0 so that sense amplifier 100 is now ready to sense the bit line current at the input node. As a result of the discharge operation, the voltage at the INTEG node is reset to a logical "0" value (i.e., the ground or Vss voltage) and the D-input to the D-FF is also reset to a logical "0" value.

Also at the rising edge of the first clock cycle, word line WL0 is asserted. As a result, word line pass transistor M25 is turned on to allow DATA0 to pass its data value to bit line 22. In the present illustration, DATA0 has a logical "1" value and thus transistor M15 is turned on and bit line current $I_{BL}$ flows in bit line 22.

The bit line current detected by sense amplifier 100 is mirrored and coupled to charge capacitor C0. The voltage at INTEG node raises until the voltage exceeds the trigger point of Schmitt trigger 104. The D-input to D-flip flop 112 (node 110) is thus asserted to a logical "1" value. At the rising edge of the next clock cycle, the logical "1" value presented at the D-input of the D-FF is passed onto the Q-output of the D-FF as the recovered data $D_{OUT}$. Thus, in FIG. 4, at the rising edge of the second clock pulse, recovered data $D_{OUT}$ is asserted to a logical "1" value.

At the rising edge of the second clock cycle, a reset pulse is again asserted to discharge integrating capacitor C0. As shown in FIG. 4, as a result of the assertion of the reset pulse, the voltage at the INTEG node and the voltage at the D-input of the D-FF are discharged to 0 volt. However, the output data $D_{OUT}$, latched by the D-FF, remains at a logical "1" value.

At the second clock cycle, the bit line read out system is operated in the same manner as described above. In this clock cycle, word line WL1 is asserted. DATA1 also has a logical 1 value causing transistor M31 to turn on and bit line current to flow in bit line 22. The voltage at the INTEG node, reset to 0 volt, begins to charge up as a result of the bit line current that is flowing in bit line 22. When the voltage at the INTEG node exceeds the trigger point of Schmitt trigger 104, the output of the Schmitt trigger is asserted and a logical "1" value is presented to the D-input of the D-FF. At the next clock cycle, D-FF 112 latches the logical "1" value onto the Q-output. Thus, the output data $D_{OUT}$ (recovered data) remains at a logical "1" value.

At the fifth clock cycle, word line WL0 is again asserted. However, at this clock cycle, DATA0 has a logical "0" value and no bit line current flows in the bit line. As a result, when sense amplifier 100 senses and mirrors the bit line current $I_{BL}$, no current is available to charge the integrator capacitor C0 and the voltage at the INTEG node remains at the reset value, that is, at 0 volt. Thus, D-input to the D-FF is at a logical "0" and the logical "0" value is clocked out as the recovered data at the next clock cycle.

As shown in FIG. 4, current sense amplifier 100 of the present invention operates effectively to detect bit line current flowing in a bit line that is indicative of data values to be recovered. In the present illustration, the presence of bit line current beyond a current sense threshold level indicates a logical "1" value while the absence of bit line current or a bit line current value less than the current sense threshold level indicates a logical "0" value. In other embodiments, the current sense amplifier of the present invention can of course be operated with the reverse polarities of data signals. That is, the presence of bit line current beyond a current sense threshold level can indicate a logical "0" value instead.

It is instructive to note that, by using the unity gain feedback loop in the input gain stage in accordance with the current sense amplifier of the present invention, the bit line voltage can be held relatively constant as shown in FIG. 4. In the present illustration, the bit line voltage is held to within 100 mV by sense amplifier 100. The ability to hold the bit line voltage constant is a significant advantage of the current sense amplifier of the present invention.

In the timing scheme shown in FIG. 4, the reset pulse and the word line are both asserted at the rising edge of a clock cycle. In a typical bit line read out system, the word line (WL) is asserted at the beginning of a clock cycle for a duration of one half a clock cycle. However, in a large array, there can be significant RC delays associated with the word line signal. As a result, the actual assertion of the WL signal at a data cell relative to the start of the clock cycle is delayed. The actual delay time is a function of the location of the selected data cell along the WL. The further away from the word line driver, the more delay is the word line signal. In operation, capacitor C0 is discharged for only a small percentage of the total clock period. Therefore, the INTEG node is free to accept the $I_{Integ}$ current for the majority of a clock cycle. Accordingly, the actual timing of the WL signal relative to the clock signal is greatly simplified. That is, it is not critical that the word line be asserted at the rising edge of the clock cycle and a variable amount of delay can be tolerated by the current sense amplifier of the present invention.

Returning to FIG. 3, while transistors M2 and M1 act in unison to hold the bit line voltage at node 102 at a constant, transistor M2 is only capable of sourcing current. In actual implementation, the bit line extends though the entire data cell array and is subject to noise pick up from a variety of sources. Noise coupling into the bit line which forces current into the bit line might be capable of driving the bit line voltage high. Transistor M2, capable of only sourcing current, would then be incapable of forcing the bit line voltage back down. In order to minimize the effect of stray noise coupling, an NMOS transistor M0 is added to the input gain stage of current sense amplifier 100. Transistor M0 is diode-connected and has it gate and drain terminals coupled to the gate terminal of transistor M1. Thus, transistor M0 is driven by the same gate voltage as transistor M1. Transistor M0 is sized identically to transistor M1. As thus configured, transistors M1 and M0 form a current mirror and transistor M0 carries the same $I_{BIAS}$ current forced into transistor M1 by the current source driving the drain terminal of transistor M1.

In operation, normal bit line current, that is, bit line current flowing out of the sense amplifier, will not change the current in transistor M0. However, transistor M0 will absorb noise currents that flow into the sense amplifier trying to force the bit line voltage high.

Transistor M0 sustains a nominal DC current equal to current $I_{BIAS}$. In operation, the current in transistor M0 will flow through transistor M2. If left uncompensated, this current can be mirrored by transistors M3 and M4 and results in charging up of the INTEG node. To prevent the current from transistor M0 from charging up the INTEG node, a hold off current $I_{Hold\_off}$ is supplied to the drain terminal of transistor M2. In the present embodiment, hold off current $I_{Hold\_off}$ has a value that exceeds the nominal DC current that flows through transistor M0. Thus, hold off current $I_{Hold\_off}$ prevents the transistor M0 current from flowing though transistor M3. Furthermore, hold off current $I_{Hold\_off}$ sinks current into transistor M3 to drive the voltage at the drain terminal of transistor M3 high, thereby turning off transistor M3. When no bit line current is flowing into sense amplifier 100, the hold off current $I_{Hold\_off}$ compensates for the current introduced by transistor M0 and ensures that transistor M3 is turned off to shut off the current mirror. In operation, hold off current $I_{Hold\_off}$ also compensates for any bit line leakage currents.

While hold off current $I_{Hold\_off}$ has a value greater than the nominal DC current of transistor M0, current $I_{Hold\_off}$ is also designed to be much smaller than the current sense threshold level selected for the bit line current $I_{BL}$. When sense amplifier 100 receives bit line current input, the bit line current needs to be large enough to overcome the hold off current. When a sufficiently large bit line current is coupled to input node 102, the voltage at the drain terminal of transistor M3 is pulled low to turn on transistor M3. The current mirror is thus activated to mirror the bit line current to charge the integrating capacitor C0.

In one embodiment, current $I_{BIAS}$ is 4 uA and hold off current $I_{Hold\_off}$ is at least 4 uA and is typically 8 uA. The current sense threshold level for the current sense amplifier is set at 20 uA. Thus, when the bit line current is less than 8 uA, there is insufficient current to overcome the hold off current $I_{Hold\_off}$ and transistor M3 remains to be off. When the bit line current is greater than 8 uA but less than 20 uA, there is sufficient current to overcome the hold off current and transistor M3 is turned on. Integrating capacitor is charged up but the voltage at the INTEG node is insufficient to trigger Schmitt trigger 104. Thus, current sense amplifier 100 will output a logic "0" as signal $D_{OUT}$. When the bit line current exceeds the 20 uA threshold, the voltage at the INTEG node will be charged up to the trigger point of Schmitt trigger 104, causing the output of the Schmitt trigger to be asserted. Current sense amplifier 100 will accordingly output a logic "1" as signal $D_{OUT}$.

The current sense threshold level of the current sense amplifier 100 of the present invention is selected for a particular design and depends on the application in which the current sense amplifier is used. Several factors determine the magnitude of and the variations in the current sense threshold level.

First, the current sense threshold level is primarily a function of the integration time which is the clock period and the amount of bit line current. The clock period determines the amount of time the input current (bit line current) is available for charging the integrating capacitor. The bit line current determines the amount of charge available to charge the integrating capacitor. If a longer charging period is available, a higher current threshold can be used or a lower bit line current can be tolerated. For instance, if the clock has a 10 ns period and the word line is asserted for 5 ns (half the period), a given current sense threshold can be met by 20 uA of bit line current being charged for 5 ns. If the clock period is extended, the same threshold level can be met with less bit line current. This is because the longer the word line is asserted, the more bit line current is available to the sense amplifier and more charge is available to charge the capacitor. For example, if the clock period is doubled, the same threshold can be met with 12 ua of bit line current. It is instructive to note that part of the input bit line current is used to overcome the hold off current and therefore, the current sense threshold does not scale linearly with the clock period. For example, assuming that the hold off current is 8 uA, with a clock period of 10 ns, the input bit line current that reaches the integrator is 20 uA−4 uA=16 uA, the 4 uA being half the hold off current that needs to be overcome. When the clock period is increased to 20 ns clock period and the bit line is asserted for 10 ns, the required input bit line current is half the integrator current (one half of 16 uA) plus the hold off current: 8 uA+4 uA=12 uA. Thus, the 20 uA for 5 ns threshold can be met with a 12 uA of bit line current for 10 ns.

On the other hand, if the clock period is shortened, to meet the same current sense threshold, more bit line current is needed. For example, if the clock period is half, the 20 uA for 5 ns current sense threshold can be met only with 36 uA of bit line current for 2.5 ns. Again the hold off current affects the current sense threshold such that with a 5 ns clock period (2.5 ns word line pulse), the current sense threshold becomes double the integrator current (double of 16 uA) plus half of the hold off current: 16 uA*2+4 uA=36 uA. In the design of the current sense amplifier, the designer typically has no control on the amount of bit line current because the amount of bit line current is determined by the design of the memory or pixel array. In general, there can be large variations in the amount of bit line current that is available to a sense amplifier even within an array. Thus, to ensure reliable readout, the current sense threshold level of the current sense amplifier needs to be set as low as possible to accommodate the large variations in bit line current values but not so low as to pick up noise that may be coupled onto the bit line.

Second, the value of the integrator capacitor can be selected to establish a certain current sense threshold. A smaller capacitance capacitor reduces the current sense threshold as less amount of charge is required for charging.

Third, the gain of the current mirror including transistors M3 and M4 can be increased to reduce the current sense threshold.

Other factors that may be considered include the magnitude of the hold off current $I_{Hold\_off}$. The larger the hold off current, the higher the current sense threshold needs to be. The shape of the bit line current pulse also affects the current sense threshold level. Typically, because of the large RC delay on the word line, there is generally a slope in the bit line current. The shape of the bit line current pulse will have some effect on the charging of the capacitor.

Figure 5:
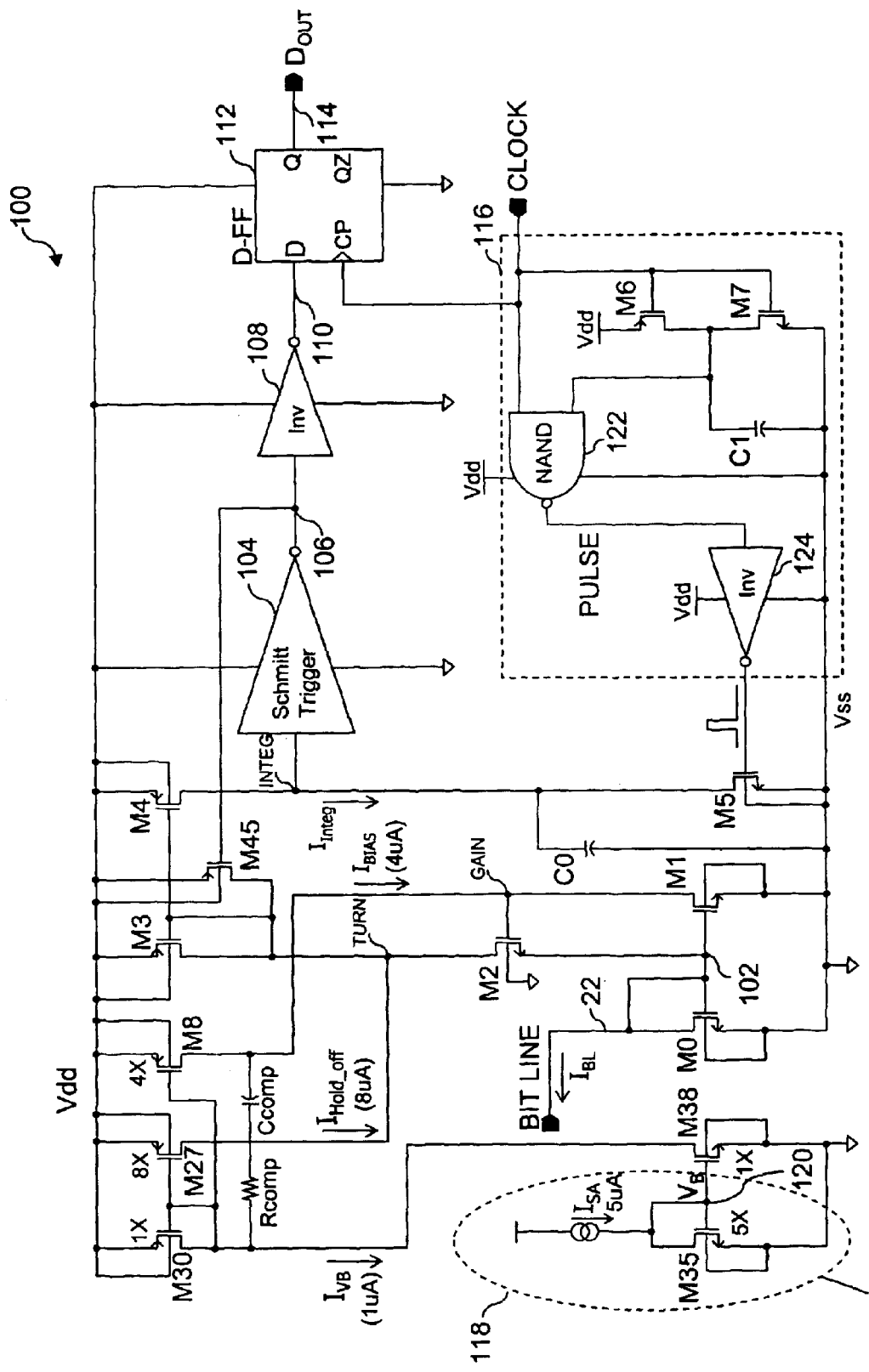
FIG. 5 is a detail schematic diagram illustrating an implementation of the current sense amplifier of FIG. 3 according to one embodiment of the present invention.

FIG. 5 is a detail schematic diagram illustrating an implementation of the current sense amplifier of FIG. 3 according to one embodiment of the present invention. In FIG. 5, circuits for generating the various internal reference currents, such as current $I_{BIAS}$ and current $I_{Hold\_off}$ are shown. Also, the circuit for pulse generator 116 is also shown. Like components in FIG. 5 and in FIG. 3 are given like reference numerals and will not be further described.

When current sense amplifier 100 of the present invention is incorporated in a large data cell array where each column of the array includes one sense amplifier, it is difficult and impractical from a layout perspective to run a large number of individual reference current lines to each sense amplifier in the array to set up the reference currents. Thus, in most cases, a common bias voltage is established and that bias voltage is coupled to each current sense amplifier in the array for use in generating the reference currents.

Referring to FIG. 5, a circuit 118 is provided to generate a bias voltage $V_B$ for driving the current sense amplifiers for generating the various internal reference currents. Circuit 118 includes a diode-connected NMOS transistor M35 driven by a current source providing a current $I_{SA}$. As thus configured, the gate voltage of transistor M35 is set at a voltage level to cause transistor M35 to conduct current $I_{SA}$. The gate voltage of transistor M35 (at node 12) is the bias voltage $V_B$ and is coupled to all the current sense amplifiers in an array. Thus, in a given data cell array, there is generally only one instance of circuit 118.

In current sense amplifier 100, bias voltage $V_B$ is coupled to the gate terminal of an NMOS transistor M38. In effect, transistor M35 and M38 form a current mirror and a base reference current $I_{VB}$ which is a ratio of the current $I_{SA}$ flows in transistor M38. In the present embodiment, transistor M35 and M38 has a 5:1 area ratio. Thus, base reference current $I_{VB}$ is one-fifth current $I_{SA}$. For example, if current $I_{SA}$ is 5 uA, current $I_{VB}$ is 1 uA. The use of transistor M38 to generate current $I_{VB}$ in the present embodiment is illustrative only. In other embodiments, other bias current generation circuit, such as a variable current source, can be used to generate current $I_{VB}$ based on the bias voltage $V_B$.

One of the difficulties with the present biasing scheme is that ground voltage drops can accumulate on the lines carrying the bias voltage which has a result of de-biasing the bias transistors. To guard against de-biasing, the gate lengths of transistors M35 and M38 are made very long in order to achieve a significant amount of gate-source over drive. For example, approximately 0.5 V of gate-source over drive is adequate. With a large over drive, small ground drops are less significant as they represent only a small fraction of the total gate source voltage. De-biasing is further guarded against by splitting the ground node connection for transistors M38 and M35 off from the rest of the sense amplifier circuit. Separating the ground connection avoids unnecessary current flow into the ground connection of bias transistors M35 and M38. Also, the bias transistors are not exposed to any signal swings which could potentially couple noise from one sense amplifier to the next.

When current sense amplifier 100 is incorporated in a large array, the large number of instances of the sense amplifiers require that the base reference current $I_{VB}$ be kept to a minimum and scaled up where appropriate. In the present embodiment, the base reference current $I_{VB}$ through transistor M38 is typically 1 uA and this current is scaled up to 4 uA by a current mirror formed by transistors M30 and M8 to provide the $I_{BIAS}$ current. Similarly, the base reference current $I_{VB}$ is scaled up to 8 uA by a current mirror formed by transistors M30 and M27 to provide the $I_{Hold\_off}$ current. In the present embodiment, the hold off current $I_{Hold\_off}$ is double the bias current $I_{BIAS}$ to provide additional hold off current to accommodate current mismatches and bit line leakage.

In a large data cell array, each of the data cell transistors connected to the bit line (such as transistors M15 and M31) contributes some parasitic capacitive loading on the bit line in addition to the parasitic capacitive loading due to the long metal line of the bit line itself. In a typical DPS array, for example, this bit line capacitance can be on the order of 1.3 pf. The bit line parasitic capacitance appears at the input node to the current sense amplifier and forms a non-dominate pole. The dominate pole of the current sense amplifier is at the drain terminal of transistor M1. Because the current sense amplifier of the present invention relies on a feedback loop to hold the input voltage at a constant and because the non-dominate pole is a part of the feedback loop, stability needs to be considered.

In the present embodiment, frequency compensation of current sense amplifier 100 is achieved by adding capacitance (capacitor Ccomp) to the dominant pole node (the GAIN node) to bring its pole frequency sufficiently below that of the non-dominant pole frequency so that unity gain is achieved prior to suffering significant phase shift. The addition of a zero (resistor Rcomp) in series with this capacitance improves the phase margin by restoring some of the lost phase margin induced by the dominate pole. This phase margin restoration occurs above the dominate pole frequency.

The compensation circuit shown in FIG. 5 employs a novel compensation scheme which greatly reduces the amount of required chip area consumed by the compensation circuit. While it is possible to compensate the current sense amplifier by connecting resistor Rcomp and capacitor Ccomp from the drain terminal of transistor M1 to ground (or to Vdd), resistor Rcomp and capacitor Ccomp are actually tied to the drain/gate terminal of transistor M30 in the present embodiment. Because transistor M30 forms a current mirror with transistor M8 with a gain of four and transistor M8 feeds current $I_{BIAS}$ into the dominate pole node (that is, node GAIN at the drain terminal of transistor M1), by coupling the compensation circuit to the drain/gate terminal of transistor M30, the gain of the current mirror is advantageously used to magnify the capacitance and to reduce the required size of the compensation capacitor. Specifically, in the present configuration, to achieve the required compensation, the required size of the compensation capacitor is reduced by the gain factor while the required size of the compensation resistor is increased by the same factor. In actual implementation, resistor Rcomp requires much less die area then capacitor Ccomp. Thus, reducing the size of capacitor Ccomp reduces the net die area consumed by the compensation circuit. In the present embodiment, resistor Rcomp is 40 kΩ and capacitor Ccomp is 10 fF.

The means by which the current mirror of transistors M30 and M8 reduces the required size of capacitor Ccomp can be understood by considering the current flow when the voltage at the drain terminal (node GAIN) of transistor M1 changes. When the voltage at the GAIN node changes, the ΔV across capacitor Ccomp induces a current in capacitor Ccomp which is amplified by the current mirror and presented to the drain terminal of transistor M1. For example, if the voltage at the drain terminal of transistor M1 tries to decrease, capacitor Ccomp and the current mirror will try and source current to prevent this decrease. The combination of capacitor Ccomp and the current mirror looks like a much larger capacitor to the drain terminal of transistor M1 due to the gain provided by the current mirror. If the gain of the current mirror is not employed, a much larger capacitance for capacitor Ccomp is needed to source the equivalent amount of current.

In operation, the magnitude of the $I_{BIAS}$ current determines the bandwidth of the current sense amplifier. Increasing the $I_{BIAS}$ current increases the bandwidth of the current sense amplifier by decreasing the impedance at the GAIN node. The impedance at the GAIN node is the inverse of the transconductance of transistor M1. The higher the bandwidth, the more able the current sense amplifier is to hold the input voltage at a constant. Larger bandwidth also shortens the time required for the current sense amplifier to recover from a bit line current pulse. That is, both the GAIN and TURN nodes settle much faster. The price for the increased bandwidth is increased power dissipation in the sense amplifier.

In a typical data cell array, there is a large variation in the bit line current across the array due to differences in ground drops, Vdd drops and word line RC effects. The variations can be as large as a factor of 10. Transistor M2 is capable of maintaining the voltage on the bit line at a constant as long as the transistor stays operating in its saturated region. However, when the bit line current gets very large, the voltage at the GAIN node can transition high (when the respective WL signal is asserted turning on the bit line current) and the voltage at the drain terminal (the TURN node) of transistor M2 will drop. The voltage will drop as a result of the large bit line current flowing though transistor M2 pulling down on the gate/drain terminal of transistor M3. This combination of conditions can force transistor M2 into its resistive region, allowing the bit line voltage to drop.

In accordance with the present invention, in order to help prevent variations in the bit line voltage due to large bit line current, a pull-up device is added to transistor M2. The pull-up device operates to force the voltage at the drain terminal of transistor M2 to the Vdd voltage when bit line current is detected. In the present embodiment, the pull-up device is a PMOS transistor M45. Transistor M45 is coupled in parallel with transistor M3 and has its gate terminal controlled by the output of Schmitt trigger 104. Thus, transistor M45 turns on when Schmitt trigger 104 is triggered. That is, when bit line current is detected, the output signal of Schmitt trigger 104 switches from a normally high state to a low state, causing PMOS transistor M45 to turn on.

Transistor M45 operates to short the TURN node (the drain terminal of transistor M2) to the Vdd voltage. By pulling the drain terminal of transistor M2 to the Vdd voltage, transistor M2 is kept in the saturation region and can therefore keep the bit line voltage at the input node at a constant. In other embodiments, other types of pull-up devices, such as an NMOS transistor, can be used as long as the correct polarity of control signal is applied.

Once transistor M45 turns on, the current though transistors M3 and M4 ceases and the INTEG node stops charging up. Instead, the voltage at the INTEG node is held constant. The use of a Schmitt trigger to measure the voltage at the INTEG node has particular advantages in the present embodiment when the INTEG node is held constant due to the action of transistor M45. If the voltage at the INTEG node is held near the trigger point, slight changes in the voltage at the INTEG node will not cause the Schmitt trigger to misfire. Noise sensitivity in the current sense amplifier of the present invention is greatly reduced due to the difference in logic thresholds for low to high and high to low transitions of the Schmitt trigger.

FIG. 5 also illustrates the detail of pulse generator 116 for generating the short reset pulse. Referring to FIG. 5, the CLOCK signal is coupled to an inverter formed by transistors M6 and M7. When the CLOCK signal is low, the output at the inverter of transistors M6 and M7 is high. The inverter output and the CLOCK signal is simultaneously provided to a NAND gate 122. The NAND gate output is coupled to an inverter 124 and the inverter output is the reset pulse. When the CLOCK signal is low and the inverter output is high, the NAND gate output is high and the inverter 124 output is low. When the CLOCK signal transitions high, the output of the inverter of transistors M6 and M7 does not immediately fall low due a capacitor C1 coupled to the output node of the inverter. Furthermore, transistor M7 is constructed with a long channel length relative its width to give it a weak pull down capability. Thus, for a short period of time, until capacitor C1 discharges, both inputs to NAND gate 122 are high forcing the output of inverter 124 high. When capacitor C1 is discharged, NAND gate 122 is driven by a low input from the inverter of transistors M6 and M7 and the output of the NAND gate transitions high while the output of inverter 124 transitions low. In this manner, a short reset pulse is generated at the rising edge of the CLOCK signal.

Transistor M5 is sized large enough to easily discharge capacitor C0 within the pulse width of the short reset pulse. The relatively long delay path to the D-input of the D-flip flop, that is, through the pulse generator, discharge of the INTEG node, through the Schmitt trigger and inverter 108, guarantees that the hold time of the flip flop is met. In the present embodiment, capacitor C0 has a capacitance of 108 fF and capacitor C1 has a capacitance of 10 fF.

Figure 6:
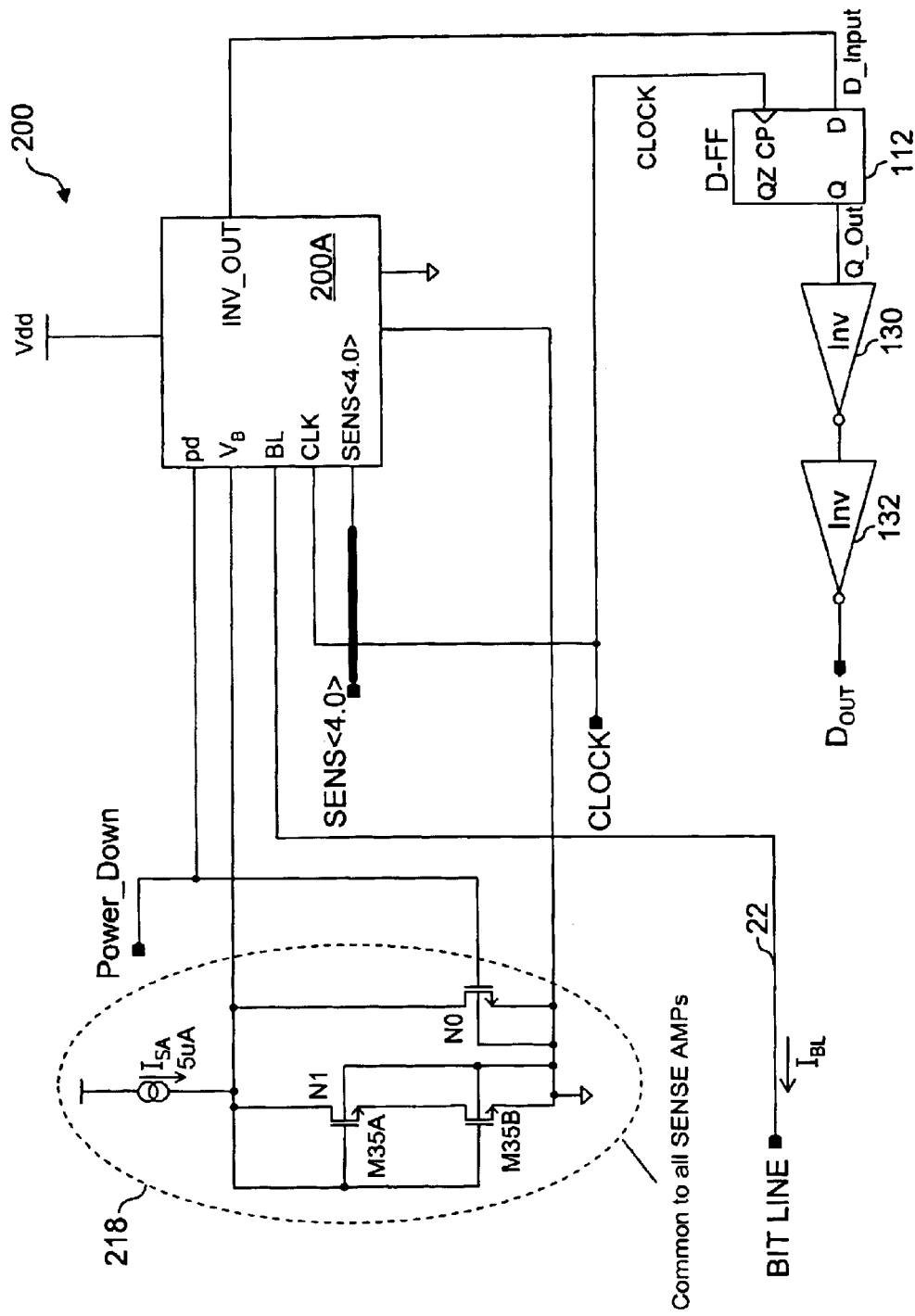
FIG. 6 illustrates a current sense amplifier and associated biasing circuit according to one embodiment of the present invention.
Figure 7:
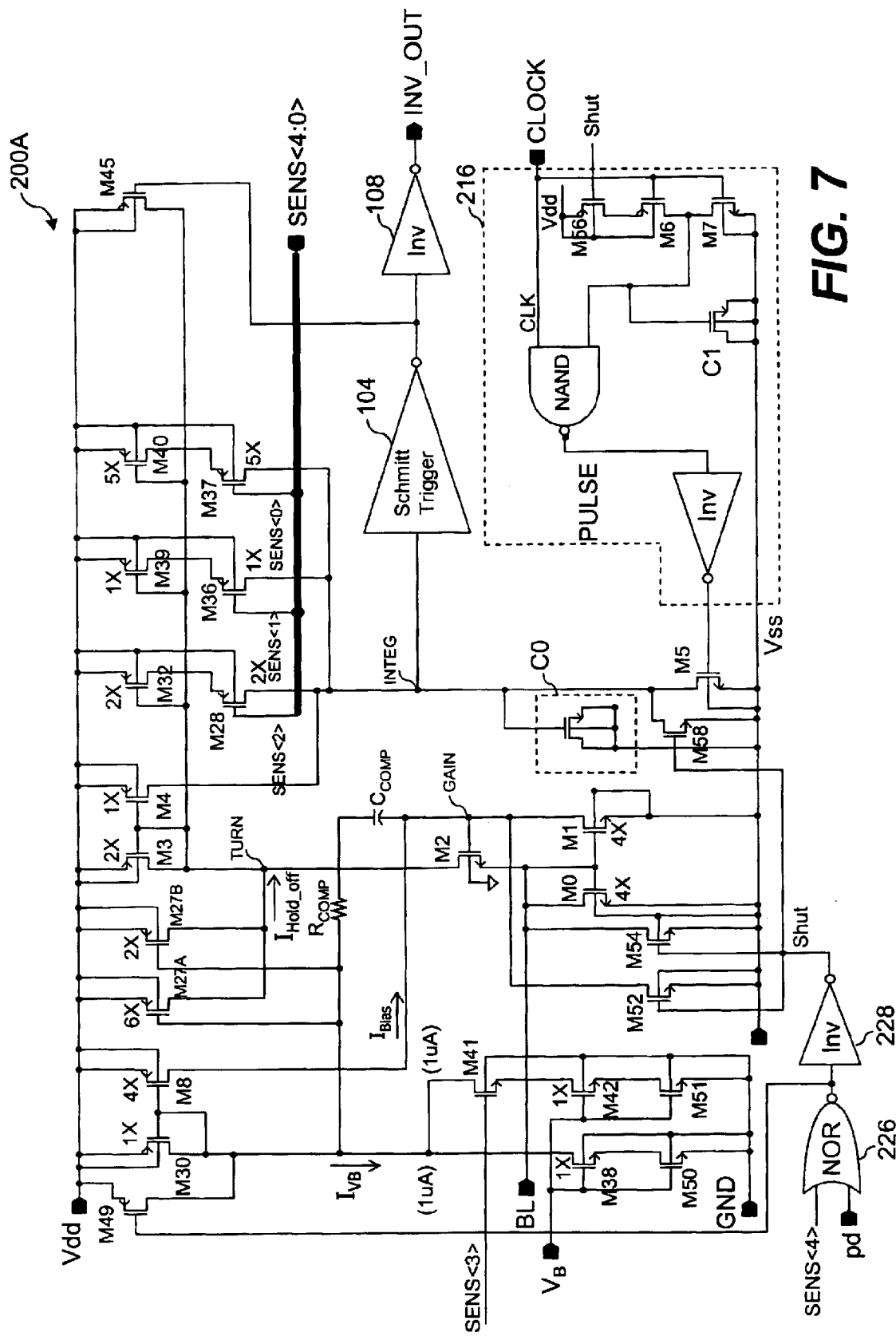
FIG. 7 is a detailed schematic diagram illustrating the implementation of the primary sensing circuit of the current sense amplifier of FIG. 6 according to one embodiment of the present invention.

FIG. 6 illustrates a current sense amplifier and associated biasing circuit according to one embodiment of the present invention. FIG. 7 is a detailed schematic diagram illustrating the implementation of the primary sensing circuit of the current sense amplifier of FIG. 6 according to one embodiment of the present invention. Like elements in FIGS. 2, 3, 5, 6 and 7 are given like reference numerals to simplify the discussion.

Referring to FIG. 6, current sense amplifier 200 is sense bit line current $I_{BL}$ on a bit line 22. Current sense amplifier 200 receives a bias voltage $V_B$ from a biasing circuit 218 for generating the internal reference currents. As discussed before, biasing circuit 218 is common to all sense amplifiers in a data cell array and provides the bias voltage $V_B$ to all the sense amplifiers. In the present embodiment, biasing circuit 218 includes a transistor M35A and a transistor M35B connected in series for generating the bias voltage $V_B$. In this implementation, two serially connected transistors M35A and M35B are used to realize a long channel length transistor. In other embodiments, when a single long channel length transistor can be used in place of the two serially connected transistors. Current sense amplifier 200 also receives a CLOCK signal as input to synchronize the operation of the sense amplifier with the external circuitry.

In the embodiment shown in FIG. 6, the Q output of D-FF 112 is coupled to two serially connected inverters 130, 132 to generate the sense amplifier output $D_{OUT}$. Inverters 130 and 132 are optional and may be included to provide buffering and amplification functions.

Also, in the present embodiment, the hold off current $I_{Hold\_off}$ is generated by the current mirror formed by transistor M30 and transistor pair M27A/M27B. Transistor pair M27A and M27B together provides 8 times current amplification of current $I_{VB}$. The use of a pair of transistors connected in parallel for generating the hold off current is illustrative only. In other embodiments, a single transistor sized accordingly to provide the desired current gain can be used.

In the present embodiment, current sense amplifier 200 includes additional features. First, current sense amplifier 200 receives a power_down signal operating to shut down the sense amplifier when the signal is asserted. The power_down signal is also coupled to bias circuit 218 and functions to shut down the bias circuit through a transistor N0.

Second, in the present embodiment, current sense amplifier 200 is provided with several programmable features. The programmable features are controlled by the control signals SENS<4,0>. The programmable features include a programmable current sense threshold, a programmable bandwidth and a programmable idle current. The programmable features of current sense amplifier 200 is further described with reference to the detail circuit diagram of FIG. 7 illustrating the primary sensing circuit 200A of current sense amplifier 200.

Referring to FIG. 7, control signals SENS<2,0> are coupled to current sense amplifier 200 for providing programmability to the current sense threshold. Specifically, control signals SENS<2,0> are coupled to the gate terminals of PMOS transistors M28, M36 and M37 acting as pass transistors. PMOS transistors M28, M36 and M37 are each coupled to a respective one of PMOS transistors M32, M39 and M40. Transistors M32, M39 and M40 are each coupled in a current mirror configuration with transistor M3. That is, the gate terminals of transistors M32, M39 and M40 are coupled to the gate/drain terminals of transistor M3. The drain terminals of transistors M32, M39 and M40 are connected through their respective pass transistors to the INTEG node. Thus, when the respective pass transistors are turned on, transistors M32, M39 and M40 are connected in parallel to transistor M4 and functions to provide additional gain to the current mirror of transistor M3. The magnitude of current $I_{Integ}$ for charging capacitor C0 is therefore increased.

By selectively asserting one or more of the control signals SENS<2,0> and turning on one or more of the pass transistors, the gain of the current mirror of transistor M3 can be adjusted. By varying the amount of integrating current $I_{Integ}$ that is available to charge capacitor C0, the current sense threshold can be accordingly adjusted. For example, increasing the gain of the current mirror decreases the current sense threshold as less bit line current is needed to charge up the integrating capacitor. In the present embodiment, transistors M32, M39 and M40 are given different size ratio with respect to transistor M3 so that different amount of gain can be programmable to obtain the precise current sense threshold. Specifically, transistor M3 has a size ratio of 2× compared to transistor M4. Transistor M32 has a size ratio of 2×, transistor M39 has a size ratio of 1×, and transistor M40 has a size ratio of 5×.

In the embodiment shown in FIG. 7, capacitor C0 is implemented as a MOS capacitor having a capacitance value of 108 fF. In other embodiments, capacitor C0 can be implemented as metal-to-metal capacitor.

Control signal SENS<3> is coupled to provide programmability to the base reference current $I_{VB}$. In accordance with the present invention, the magnitude of the base reference current $I_{VB}$ can be doubled when control signal SENS<3> is asserted. Because the base reference current $I_{VB}$ is used to generate other internal reference currents such as current $I_{BIAS}$ and current $I_{Hold\_off}$, adjusting the magnitude of the base reference current $I_{VB}$ will adjust the magnitude of current $I_{BIAS}$ and current $I_{Hold\_off}$. Increasing the current $I_{BIAS}$ has the effect of increasing the bandwidth of the sense amplifier and allowing the sense amplifier to respond faster to changes in the bit line current.

Referring to FIG. 7, the bias voltage $V_B$ is coupled to drive two pairs of serially connected transistors for generating the base reference current $I_{VB}$. Specifically, a first pair of serially connected transistors M38 and M50, driven by the bias voltage $V_B$, are connected directly to the drain terminal of transistor M30 and is therefore always activated to generate a first portion of the base reference current $I_{VB}$. A second pair of serially connected transistors M42 and M51, driven by the bias voltage $V_B$, is connected to the drain terminal of transistor M30 through a pass transistor M41. In the present embodiment, a pair of serially connected transistors M38 and M50 is used to realize a long channel length transistor. Similarly, a pair of serially connected transistors M42 and M51 is used to realize a long channel length transistor. In both of these cases, a single long channel length transistor can be used to replace the two serially connected transistors.

Pass transistor M41 is controlled by control signal SENS<3> and turns on when the control signal is asserted to connect the drain terminal of transistor M42 to the drain terminal of transistor M30. In this manner, transistor pair M42 and M51 is selectively turned on to introduce an addition portion of current to the base reference current $I_{VB}$. In the present embodiment, transistor M42 and transistor M38 have the same size ratio of 1×. Thus, when transistor pair M42 and M51 is turned on, the base reference current $I_{VB}$ is doubled. In the present embodiment, transistor pair M38 and M50 provides 1 uA of base reference current $I_{VB}$. When transistor pair M42 and M51 is turned on by control signal SENS<3>, the base reference current $I_{VB}$ is increased to 2 uA.

Finally, control signal SENS<4> and power_down signal "pd" are coupled to current sense amplifier 200 for shutting off internal current paths in the current sense amplifier to allow for a minimum current draw state. The power down function permits the sense amplifier to conserve power when the sense amplifier is not in use.

Referring to FIG. 7, control signal SENS<4> and power_down signal pd are input signals to a NOR gate 226. The output terminal of NOR gate 226 is coupled to an inverter 228. The output of inverter 228 is a Shut signal used to direct certain parts of the sense amplifier circuit to shut off. When either one of control signal SENS<4> and power_down signal pd is asserted (logical "1"), NOR gate 226 output will transition low and the output of inverter 228 will transition high to indicate shut off is selected.

In the present embodiment, the Shut signal is coupled to shut off the following circuits. First, the inverse of the Shut signal (at the output of NOR gate 226) is coupled to drive a PMOS transistor M49. Transistor M49 is coupled across transistor 30 generating the base reference current $I_{VB}$. Thus, transistor M49 operates to shut off the reference current generating circuit.

Second, the Shut signal is coupled to shut off pulse generator 216. The Shut signal drives a PMOS transistor M56 connected in series between the Vdd voltage and the inverter pair of transistors M6 and M7. When the Shut signal is not asserted (logical low), transistor M56 is turned on and inverter pair M6 and M7 is activated to generate the reset pulse. When the Shut signal is asserted (logical hi), transistor M56 is turned off and inverter pair M6 and M7 is disconnected from the Vdd voltage and is thus deactivated. No reset pulse will then be generated.

Third, the Shut signal drives the gate terminal of an NMOS transistor M58 Transistor M58 is coupled in parallel with transitory M5 and both transistors are therefore coupled to discharge capacitor C0. When the Shut signal is asserted, transistor M5B is turned on and capacitor C0 is shorted to ground. As a result, Schmitt trigger 104 is deasserted.

Lastly, the Shut signal is coupled to shut off the $I_{BIAS}$ current path and the input current path. Specifically, the Shut signal is coupled to drive the gate terminal of transistor M52. The drain terminal of transistor M52 is coupled to the GAIN node which is the drain terminal of transistor M1. Thus, when the Shut signal is asserted and transistor M52 is turned on, transistor M1 is shorted out and current $I_{BIAS}$ is directed to the ground node. Similarly, the Shut signal is coupled to drive the gate terminal of transistor M54. The drain terminal of transistor M54 is coupled to the input node 102 which is the source terminal of transistor M2. Thus, when the Shut signal is asserted and transistor M54 is turned on, the input current from bit line 22 is directed to the ground node.

As described above, the current sense threshold level of the current sense amplifier of the present invention is selected for a particular design and depends on the application in which the current sense amplifier is used. In some applications, it is desirable to reduce the current sense threshold. A low current sense threshold is needed, for example, when the clock frequency of the circuit in which the current sense amplifier is incorporated is increased. The clock period determines the amount of time the input current is available for charging the integrating capacitor. As the clock frequency increases, the duration of time the input current pulse is available for charging the integrating capacitor is accordingly decreased. In order to guarantee detection of the presence of input current, the current sense threshold needs to be reduced. Also, in some applications, the magnitude of input current may be limited due to design constraints of the circuitry in which the current sense amplifier is incorporated. The current sense threshold of the current sense amplifier needs to be reduced to improve the sensitivity of the sense amplifier to accommodate the reduced magnitude of the input current.

However, when the current sense threshold is reduced, the current sense amplifier becomes more sensitive to variations of the threshold level which variations are inherently present in analog circuits. It is well known that analog circuits are subject to performance variations due to variations in the device characteristics, device matching, as well as operational environmental (such as supply voltage variations or operation temperature variations). Thus, the current sense threshold of the current sense amplifier will inherently vary about the predetermined value. This variation does not pose a problem as long as the input current is larger than the maximum value the current sense threshold can vary up to and as long as the current sense threshold does not get so small as to be sensitive to noise on the input signal line. However, as the magnitude of the input current decreases and as the current sense threshold decreases, less variations in the current sense threshold can be tolerated and the required accuracy of the current sense threshold increases.

However, the means to achieve a lower current sense threshold and to achieve reduced variations in the threshold level often run in direct opposition to each other. For instance, means to reduce threshold variations tends to decrease the bandwidth of the current sense amplifier. But as the current sense threshold of the current sense amplifier is reduced, a higher bandwidth is actually needed. The reason for a higher bandwidth requirement is as follows. A current sense amplifier operates to hold the input node (such as the bit line) at a constant voltage. Should the bit line voltage move, the charge on the bit line capacitance will change, interfering with the detection of charge from the data cell. In practice, it is impossible for the bit line voltage to remain perfectly constant when detecting the bit line current.

Bit line voltage (or input node voltage) variations are not a problem as long as the change in bit line voltage is small or if the voltage recovers within the detection window or the bit line current (the input current) is sufficiently large to swamp the charge disturbance of the bit line capacitance. The bandwidth of the sense amplifier greatly affects both the change in the bit line voltage as well as the recovery time. A high bandwidth reduces both the change in the bit line voltage and the recovery time. As the current sense threshold is reduced, it is necessary to increase the bandwidth of the sense amplifier in order to guarantee the complete settling of the bit line voltage prior to the next detection window.

Figure 8:
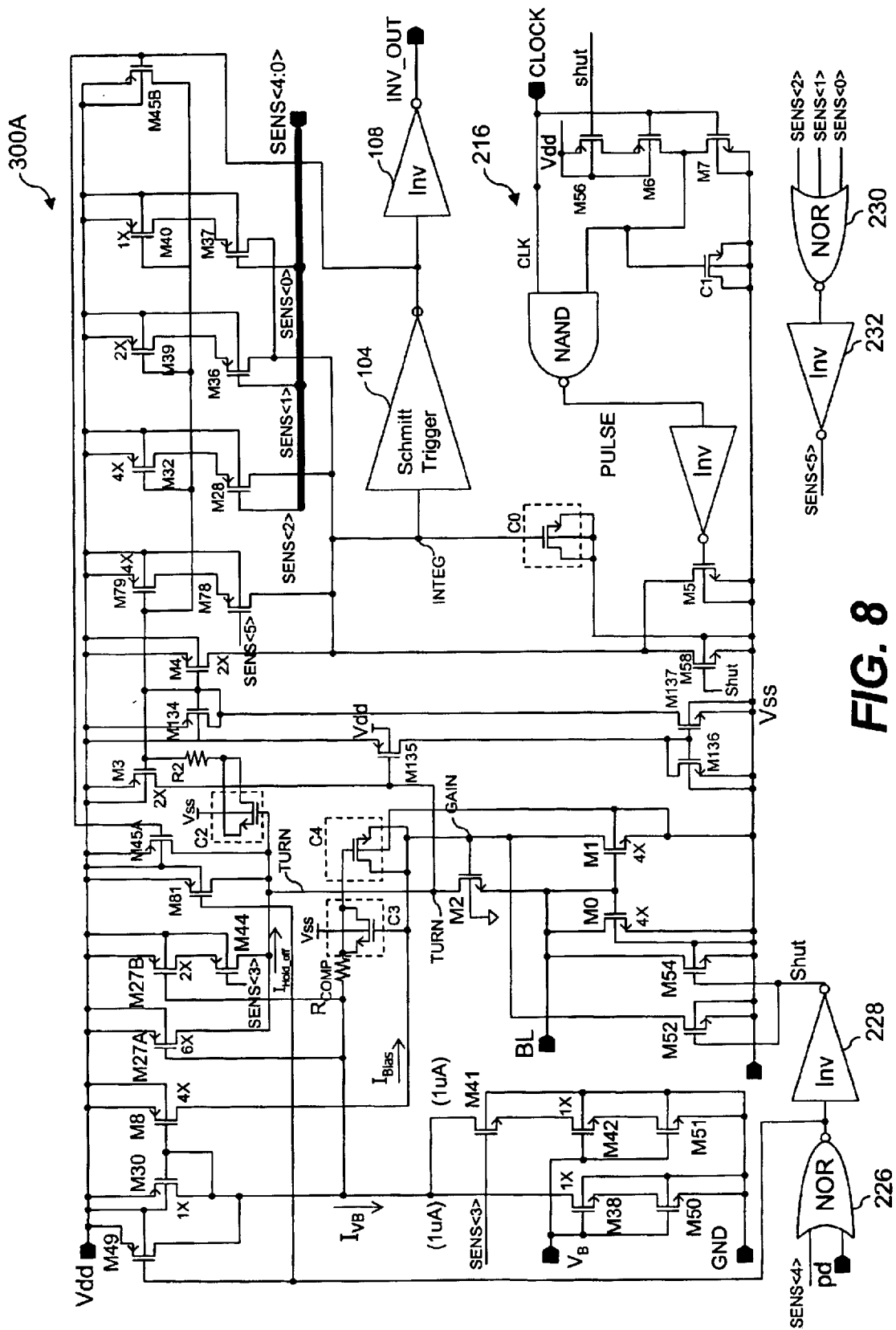
FIG. 8 is a schematic diagram of the primary sensing circuit of the current sense amplifier of FIG. 6 according to an alternate embodiment of the present invention.

According to one aspect of the present invention, the current sense amplifier incorporates circuit features to enhance the performance of the sense amplifier. Specifically, the circuit features permit the current sense amplifier of the present invention to operate at reduced current sense threshold and reduced variations in the threshold level due to variations in device and operational parameters. Thus, the current sense amplifier can be operated at high frequencies while maintaining acceptable level of sensing sensitivity. FIG. 8 is a schematic diagram of the primary sensing circuit of the current sense amplifier of FIG. 6 according to an alternate embodiment of the present invention. In the following description, the current sense amplifier of FIG. 6 incorporating the primary sensing circuit 300A of FIG. 8 is referred to as current sense amplifier 300. Current sense amplifier 300 incorporate circuit features for reducing the current sense threshold as well as reducing the variations in the current sense threshold level.

A primary factor contributing to the variation in the current sense threshold is the matching of transistors M30, M27 and M8 (FIG. 5) which transistors generate the bias currents $I_{BIAS}$ and $I_{Hold\_off}$. The matching of these devices is a function of the size of the devices. Increasing the device sizes will improve the device matching. However, increasing the device sizes also increases the capacitive loading on the GAIN node of the current sense amplifier as well as the capacitance at the gate terminal of transistor M30. Increasing the capacitive loading on the GAIN node will reduce the bandwidth of the current sense amplifier. Increasing the capacitance at the gate of transistor M30 operates to destabilize the compensation provided by resistor Rcomp and capacitor Ccomp. This de-stabilization can be corrected by increasing the capacitance of capacitor Ccomp which in turn further reduces the bandwidth of the sense amplifier by further capacitive loading of the GAIN node. Also, increasing the size of transistor M27 or transistor pair M27A/M28B increases the capacitive loading on the TURN node which increase the charge lost due to necessary voltage movement of this node. These effects need to be accounted and compensated for by other circuit features in the primary sensing circuit of the current sense amplifier.

According to one embodiment of the present invention, the size of transistors M30, M8 and transistor M27 (or transistor pair M27A/M27B) of current sense amplifier 300 is increased by a factor of 9 as compared to the same transistors in the current sense amplifier of FIG. 7 to improve the matching of these devices. Increasing the matching by 9 will realize a transistor threshold voltage matching improvement by a factor of 3 (the square root of 9). In this manner, the variation in the current sense threshold of current sense amplifier 300 can be improved by a factor of 1.5 over current sense amplifier 200.

The bandwidth reduction resulted from the increased transistor sizes can be restored by increasing the bias currents $I_{BIAS}$ and $I_{Hold\_off}$ in transistors M2 and M1. In the present embodiment, the increase in the bias currents is achieved by increasing the base reference current $I_{VB}$. Referring to FIG. 8, the base reference current $I_{VB}$ can be increased by asserting pass transistor M41 through control signal SENS<3>. In the present embodiment, transistors M38 and M50 controlled by bias voltage $V_B$ each provides 1 uA of base reference current. By turning on pass transistor M41, transistors M42 and M51, also controlled by bias voltage $V_B$, are connected in parallel with transistors M38 and M50 and provide another 1 uA of base reference current. In this manner, base reference current $I_{VB}$ is doubled to 2 uA. In the embodiment shown in FIG. 8, bias current $I_{BIAS}$ is 4 times current $I_{VB}$ and is therefore increased to 8 uA and hold off current $I_{Hold\_off}$ is 6 times current $I_{VB}$ and is therefore increased to 12 uA. In accordance with the present invention, the bias currents $I_{BIAS}$ and $I_{Hold\_off}$ are increased to insure a sufficiently high bandwidth even after the size of the compensation capacitor is increased.

With the increases sizing of transistors M30, M8 and M27A/27B, compensation of current sense amplifier 300 requires a compensation capacitor Ccomp with three times increase in capacitance. In the primary sensing circuit 200A of FIG. 7, capacitor Ccomp is constructed as a metal-to-poly capacitor. However, metal-to-poly capacitor is not suitable for large capacitance values. In the embodiment shown in FIG. 8, the compensation capacitor Ccomp of primary sensing circuit 300A is implemented as MOS capacitors C3 and C4. Each of capacitors C3 and C4 has a capacitance value of 36 fF. Resistor Rcomp has a resistance value of 40 kΩ.

Furthermore, in the present embodiment, capacitors C3 and C4 are connected in parallel but with their polarities reversed. That is, the gate terminal of the transistor forming capacitor C3 is connected to the GAIN node while the source/drain terminals are connected to resistor Rcomp. On the other hand, the gate terminal of the transistor forming capacitor C4 is connected to resistor Rcomp while the source/drain terminals are connected to the GAIN node.

Connecting the two MOS capacitors in reverse polarities has the advantage of guaranteeing a minimum amount of compensation capacitance despite the polarities of the voltages driving the terminals of the MOS capacitors. A MOS capacitor only operates effectively as a capacitor when the gate voltage is greater than or equal to the source voltage. In operation, the voltage polarity driving the compensation capacitors (capacitors C3 and C4) is a function of environmental and process parameters and a particular voltage polarity cannot be guaranteed. Thus, by connecting the MOS capacitors C3 and C4 in reverse polarities, at least one of the MOS capacitors will operate as a capacitor to provide compensation.

As the bit line current reduces, it becomes increasingly important that charge not be lost in the current sense amplifier circuit. That is, it is more critical that the charge in the data cell can be fully transferred to the detection node (the INTEG node) of the current sense amplifier. Referring to FIG. 7, one place were charge is lost is at the drain terminal of transistor M2 (the TURN node). The voltage at the TURN node moves from the Vdd voltage down to approximately Vdd-Vt when bit line current is detected from the data cell. This voltage movement coupled with the capacitance at the TURN node represents lost charge where charge Q is the product of the capacitance and the change in voltage at the node.

The capacitance at the TURN node is a function of the gate capacitance of transistors M3, M4, M32, M39 and M40. In the embodiment shown in FIG. 7, the current mirror of transistors M3 and M4 has a maximum gain of 4.5 (i.e., 9×/2×). In the embodiment shown in FIG. 8, the gain of the current mirror is increased by increasing the size of transistors M4, M79, M32, M39 and M40 relative to transistor M3. In the present embodiment shown in FIG. 8, the current mirror gain can be increased from a maximum of 4.5, as shown in the embodiment of FIG. 7, to 6.5 (i.e., 13×/2×). In this manner, the input current being mirrored is amplified which effectively reduces the current sense threshold. However, increasing the current mirror gain increases the capacitance at the TURN node which is undesirable as it results in increased lost charge, tending to offset the desired reduction in the current sense threshold.

According to one aspect of the present invention, current sense amplifier 300 incorporates a "super current mirror" operating to mirror the input current at the TURN node to a current in the INTEG node without significant loss of charge. Referring to FIG. 8, the super current mirror in primary sensing circuit 300A includes PMOS transistors M3, M4, M79, M32, M39 and M40, PMOS transistors M134 and M135 and NMOS transistors M136 and M137. To facilitate the present discussion, FIGS. 9A and 9B are provided which figures illustrate the circuit diagrams of the traditional diode current mirror used in the current sense amplifier of FIG. 7 and the super current mirror used in the current sense amplifier of FIG. 8.

Referring to FIG. 9A, the gate capacitance Cgate of transistors M3 and M4 is coupled to the TURN node. Thus, any voltage movement at the TURN node, combined with the gate capacitance, contributes to loss of charge from the input current $I_{BL}$. However, in super current mirror of the present invention, the gate capacitance Cgate is isolated from the TURN node so that significantly less capacitance are coupled to the TURN node. In this manner, significant reduction in loss of charge can be realized, despite voltage movements at the TURN node and despite increased gate capacitance due to increasing the gain of the current mirror.

Referring to FIG. 9B, the super current mirror of current sense amplifier 300 includes transistor M3 coupled to receive the input current from the TURN node and transistor M4 coupled to provide a mirrored current $I_{out}$ to the INTEG node for charging integrating capacitor Co. Furthermore, the super current mirror includes PMOS transistor M135 having its gate terminal connected to the TURN node. The drain terminal of transistor 135 is coupled to a current mirror formed by NMOS transistors M136 and M137. The current mirror of transistors M136 and M137 provides a current at a node 350 driving diode-connected PMOS transistor M134. Specifically, the drain and gate terminals of transistor M134 are both connected to node 350. Because the gate terminals of transistors M3 and M4 are both connected to node 350, transistors M3, M4 and M134 in effect form two current mirrors for mirroring the current driving transistor M134.

The super current mirror of FIG. 9B operates as follows. When the input current, such as bit line current $I_{BL}$, exceeds the hold off current $I_{Hold\_off}$, the voltage at the gate terminal of transistor M135 drops until transistor M135 starts to conduct. The current in transistor M135 is mirrored by the current mirror of transistors M136 and M137. The mirrored current drives diode connected transistor M134. Transistor M3 mirrors the current in transistor M134 and provides current to the TURN node, completing the negative feedback loop. Transistor M4 mirrors the current in transistor M3 and provide the output current $I_{out}$. In effect, transistor M134 serves two purposes. One is to reduce the total loop gain of the negative feedback loop and thereby aiding in stabilizing the super current mirror. The other purpose is to provide drive current to the gate terminals of transistors M3 and M4 in opposition to the current flowing in transistor M137, thus allowing the voltage at the gate terminal of transistors M3 and M4 to move in either the positive or the negative direction. The charge lost at the TURN node is greatly reduced due to the greatly reduced capacitance at the TURN node in the super current mirror of FIG. 9B.

Figure 10A:
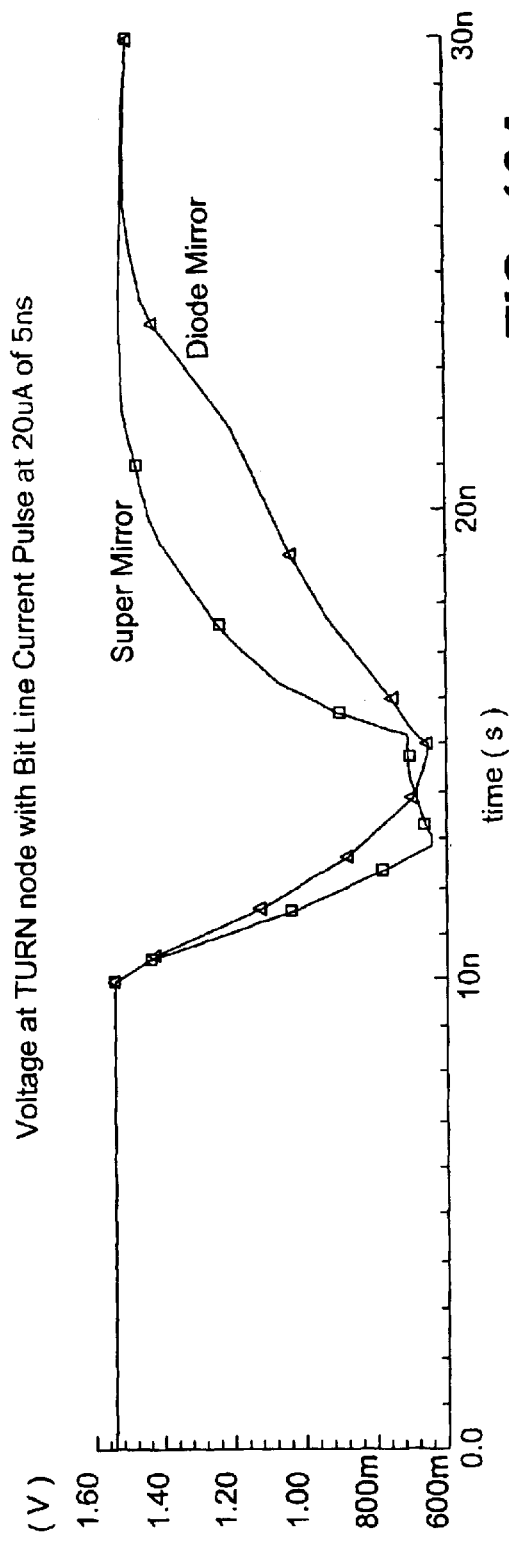
FIG. 10A is a graph comparing the behavior of the voltage at the output node of the gain stage for the current mirror of FIG. 9A and the current mirror of FIG. 9B.
Figure 10B:
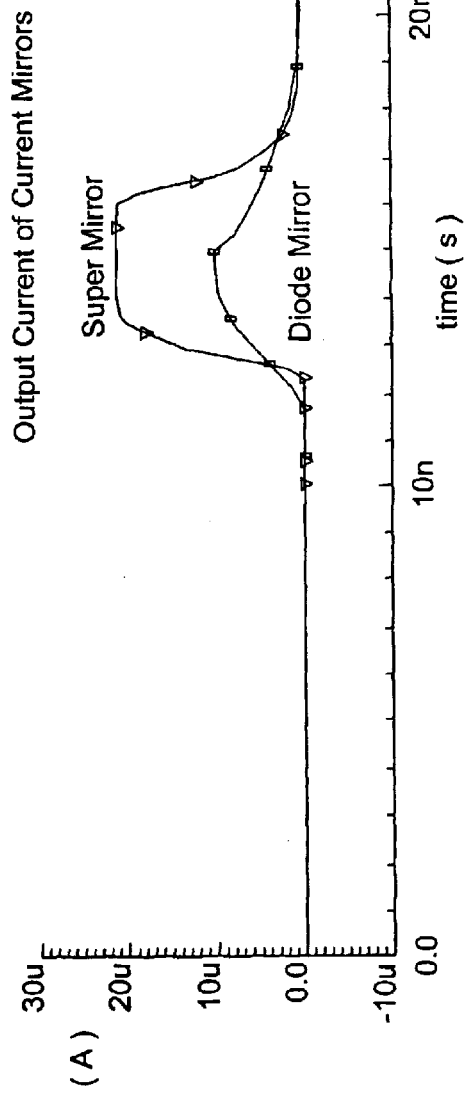
FIG. 10B is a graph comparing the behavior of the output current of the current mirror of FIG. 9A and the output current of the current mirror of FIG. 9B.

FIG. 10A is a graph comparing the behavior of the voltage at the output node of the gain stage (the TURN node) for the current mirror of FIG. 9A and the super current mirror of FIG. 9B. FIG. 10B is a graph comparing the behavior of the output current $I_{out}$ of the current mirror of FIG. 9A and the output current of the super current mirror of FIG. 9B. In this illustration, it is assumed that the input current is a 5 ns pulse with a 20 uA magnitude. Referring to FIG. 10B, the super current mirror is capable of achieving a much larger current amplitude in the output current $I_{out}$ than that of the traditional diode current mirror of FIG. 9A. Also, referring to FIG. 10A, when the super current mirror is used, the voltage at the TURN node has a much faster rise and fall time as compared to the case when the traditional diode current mirror is used. This illustrates that the capacitance coupled to the TURN is reduced in the super current mirror, thereby allowing less loss of charge and realizing increased bandwidth of operation. Another point to note in FIG. 10A is that the magnitude of the voltage swing for both the diode current mirror and the supper current mirror is about the same. It is important that the super current mirror does not increase the voltage swing since transistor M2 (in FIGS. 7 and 8) does not have sufficient headroom to allow for larger voltage swings.

Because the super current mirror operates using negative feedback, compensation of this feedback loop needs to be considered. Referring to FIG. 8, a capacitor C2 and a resistor R2 are coupled between the TURN node and the gate terminal of transistor M3 to provide compensation. In the present embodiment, resistor R2 has a resistance value of 50 KΩ and capacitor C2 has a capacitance value of 30 fF.

When current sense amplifier 300 incorporates the super current mirror, pull-up devices, in the form of transistors M45A and M45B, can be included to enhance the operation of the current sense amplifier. Transistor M45A is connected in the same manner as transistor M45 in current sense amplifier 200 of FIG. 7. Transistor M45A operates to pull the voltage at the TURN node high when the Schmitt Trigger output is asserted, that is, when the input current exceeding the current sense threshold is detected. In addition to transistor M45A, current sense amplifier 300 includes a PMOS transistor 45B to turn off the super current mirror when input current exceeding the threshold is detected. Specifically, transistor M45B is a pull-up device coupled to pull up the voltage at node 350 to the Vdd voltage when the Schmitt trigger output is asserted (that is, when input current exceeds the current sense threshold). When the voltage at node 350 is pulled high, transistor M3 is turned off and the super current mirror is thereby turned off. Turning off the super current mirror is important to allow fast recovery of the current mirror from one detection cycle to the next. Because of the high capacitance at the gate terminals of transistors M3 and M4 (denoted as capacitance Cgate), the time constant to turn off these devices is not insignificant. Thus, by incorporating pull-up device M45B, the charge at the gate terminals of transistors M3 and M4 can be removed quickly once a successful detection is made.

Returning to FIG. 8, current sense amplifier 300 further includes a PMOS transistor M81 controlled by the Shut signal and coupled across transistor M27A. Transistor M81 operates to shut off the current mirror of transistor M30 and transistor pair M27A/M27B so that bias current $I_{Hold\_off}$ is turned off.

Current sense amplifier 300 further includes a PMOS transistors M78 and M79 for providing further programmability of the current sense threshold. Transistor M78 act as a pass transistor and is controlled by a control signal SENS<5>. Control signal SENS<5> is the logical OR of control signals SENS <2,0>, as generated by NOR gate 230 and inverter 232. Thus, whenever all control signals SENS<2-0> are asserted low, control signal SENS<5> is asserted to a logic low level. Transistor M79 is coupled in a current mirror configuration with transistor M3. That is, the gate terminal of transistor M79 is coupled to the gate terminal of transistor M3. The drain terminal of transistor M79 is connected through pass transistor M78 to the INTEG node. Thus, when the pass transistor is turned on, transistor M79 connected in parallel to transistor M4 and functions to provide additional gain to the current mirror of transistor M3. The magnitude of current $I_{Integ}$ for charging capacitor C0 is therefore increased with a corresponding decrease in the sense amplifier current threshold.

In the embodiment shown in FIG. 8, various transistors are included to realize power shut-off and current sense threshold programmability functions. It is understood that transistors implementing power shut-off and threshold programmability functions are optional in the current sense amplifier of the present invention and the transistors may be included as desired to enhance the operational characteristics of the current sense amplifier.

The above detailed descriptions are provided to illustrate specific embodiments of the present invention and are not intended to be limiting. Numerous modifications and variations within the scope of the present invention are possible. For example, in the current sense amplifier of the present invention, a D-flip flop is used to latch the output signal of the Schmitt trigger. In other embodiments, other circuits can be used to latch the output signal of the Schmitt trigger. In other embodiments, a register or a latch circuit, driven by the CLOCK signal, can be used to latch the output signal and provide the output signal synchronous with the circuit in which the current sense amplifier is incorporated. Also, in the above descriptions, the current sense amplifier of the present invention includes a unity gain feedback loop in the input gain stage. However, the feedback loop that can be incorporated in the input gain stage is not limited to a unity gain feedback loop. In other embodiments, feedback loops having a gain other than unity gain can be used.

Also, in the above embodiments, the current sense amplifier of the present invention uses a Schmitt trigger to compare the integrated voltage at the INTEG node to a trigger point for determining the presence or absence of input current. The use of a Schmitt trigger is illustrative only. In other embodiments, a comparator can be used to compare the voltage at the INTEG node with a reference voltage. However, in most applications, a comparator with hysteresis is desired to avoid erratic output switching when the input voltage is passing through the comparator threshold.

Furthermore, the above embodiments illustrates implementations of the current sense amplifier of the present invention using N-type and P-type transistors. One of ordinary skill in the art would appreciate that in implementing the current sense amplifier of the present invention, the polarities of the transistors can be reversed with corresponding changes in the control voltage and current signals. The embodiments described above are illustrative only.

Moreover, the current sense amplifier of the present invention is suitable for use in any applications including a large array of signal lines where noise reduction in the signal lines is critical. By using current sensing instead of voltage sensing, significant noise reduction can be achieved. The use of the current sense amplifier in a memory array or a image sensor array in the above descriptions is illustrative only. The present invention is defined by the appended claims.

I claim:

1. A current sense amplifier circuit coupled to detect a first current flowing in a first node, comprising:

an input gain stage incorporating a feedback loop, the first current being coupled to an input node of the input gain stage, wherein the input gain stage operates to maintain the voltage at the input node at a substantially constant level;

a current mirror coupled to an output node of the input gain stage to mirror the first current into a second current;

a charge integration stage coupled to integrate charge associated with the second current to develop a first voltage; and a comparator coupled to compare the first voltage to a reference level and providing an output signal at an output terminal, wherein the comparator generates an output signal having a first value when the first current exceeds a predetermined threshold level and a second value when the first current is less than the predetermined threshold level.

2. The current sense amplifier circuit of claim 1, wherein the input gain stage comprises:

a first transistor having a control terminal being the input node, a first current handling terminal coupled to receive a first bias current, and a second current handling terminal coupled to a first power supply voltage; and a second transistor having a control terminal coupled to the first current handling terminal of the first transistor, a first current handling terminal coupled to the current mirror and being the output node of the input gain stage, and a second current handling terminal coupled to the input node, wherein the first transistor is biased to conduct a current substantially equal to the first bias current, and the second transistor forms the feedback loop to maintain the voltage at the input node at a substantially constant level.

3. The current sense amplifier circuit of claim 2, wherein the input gain stage comprises a unity gain input gain stage.

4. The current sense amplifier circuit of claim 2, wherein the input gain stage further comprises:

a third transistor having a control terminal and a first current handling terminal both coupled to the input node, and a second current handling terminal coupled to the first power supply voltage; and a current source coupled to provide a second bias current to the first current handling terminal of the second transistor, wherein the third transistor conducts a current substantially equal to the current being conducted by the first transistor and the second bias current is at least as large as the current being conducted in the third transistor.

5. The current sense amplifier circuit of claim 1, wherein the current mirror comprises:

a fourth transistor having a control terminal and a first current handling terminal coupled to the output node of the input gain stage and receiving the input current, and a second current handling terminal coupled to a second power supply voltage; and a fifth transistor having a control terminal coupled to the control terminal of the fourth transistor, a first current handling terminal coupled to a second node and providing the second current, and a second current handling terminal coupled to the second power supply voltage.

6. The current sense amplifier circuit of claim 1, wherein the charge integration stage comprises:

a first capacitor having a first plate coupled to receive the second current and a second plate coupled to the first power supply voltage.

7. The current sense amplifier circuit of claim 6, wherein the charge integration stage further comprises:

a sixth transistor having a control terminal receiving a first pulse, a first current handling terminal coupled to the first plate of the first capacitor and a second current handling terminal coupled to the first power supply voltage, wherein the first pulse is selectively applied to discharge the first capacitor.

8. The current sense amplifier circuit of claim 7, wherein the charge integration stage further comprises:

a pulse generator generating the first pulse based on a clock signal, the first pulse having a pulse width that is a fraction of the clock period of the clock signal, wherein the clock signal determines when the current sense amplifier provides a signal indicative of the output signal of the comparator and the first pulse is generated for each clock cycle to discharge the first capacitor.

9. The current sense amplifier circuit of claim 7, wherein the first pulse has a pulse width that is less than 10% of the clock period of the clock signal.

10. The current sense amplifier circuit of claim 1, wherein the comparator comprises: a comparator with hysteresis, the comparator having a first reference level for detecting a low-to-high transition and a second reference level for detecting a high-to-low transition, the first voltage being compared with a selected one of the first or second reference level.

11. The current sense amplifier circuit of claim 1, wherein the comparator comprises:

a Schmitt trigger having a first trigger point defining the reference level, the Schmitt trigger receiving the first voltage as an input voltage and providing the output signal having the first value when the first voltage exceeds the first trigger point of the Schmitt trigger.

12. The current sense amplifier circuit of claim 11, wherein the Schmitt trigger comprises an inverting stage and the comparator further comprises an inverter having an input terminal coupled to receive the output signal of the Schmitt trigger and generating a second output signal having an inverse logical value as the output signal.

13. The current sense amplifier circuit of claim 1, further comprising:

an output stage for receiving a signal corresponding to the output signal of the comparator and providing a second output signal based on a clock signal.

14. The current sense amplifier circuit of claim 13, wherein the output stage comprises a D-flip flop receiving the signal corresponding to the output signal of the comparator and the clock signal as input signals, the D-flip flop providing the second output signal based on the clock signal.

15. The current sense amplifier circuit of claim 4, further comprising:

a variable current source coupled to receive a bias voltage and generate the first and second bias currents based on the bias voltage.

16. The current sense amplifier circuit of claim 4, further comprising:

a seventh transistor having a control terminal coupled to receive a bias voltage, a first current handling terminal coupled to a third node and a second current handling terminal coupled to the first power supply voltage, wherein the bias voltage causing the seventh transistor to conduct a reference current; and a first circuit coupled to the third node to generate the first and second bias currents based on the reference current.

17. The current sense amplifier circuit of claim 16, wherein the seventh transistor comprises a long channel length transistor.

18. The current sense amplifier circuit of claim 17, wherein the seventh transistor comprises a pair of serially connected transistors.

19. The current sense amplifier circuit of claim 16, wherein the first circuit comprises:

an eighth transistor having a control terminal and a first current handling terminal coupled to the third node, a second current handling terminal coupled to the second power supply voltage;

a ninth transistor having a control terminal coupled to the third node, a first current handling terminal providing the first bias current and a second current handling terminal coupled to the second power supply voltage; and a tenth transistor having a control terminal coupled to the third node, a first current handling terminal providing the second bias current and a second current handling terminal coupled to the second power supply voltage, wherein the ninth transistor and the eighth transistor form a second current mirror and the magnitude of the first bias current is a function of the reference current and the size ratio of the ninth transistor and the eighth transistor, and the tenth transistor and the eighth transistor form a third current mirror and the magnitude of the second bias current is a function of the reference current and the size ratio of the tenth transistor and the eighth transistor, the third current mirror being the current source generating the second bias current.

20. The current sense amplifier circuit of claim 16, further comprising:
   a resistor coupled between the third node and a fourth node; and
   a second capacitor coupled between the fourth node and the first current handling terminal of the first transistor,
   wherein the resistor and the second capacitor provide frequency compensation for the input gain stage.

21. The current sense amplifier circuit of claim 5, further comprising:
   a pull-up device coupled to the output node of the input gain stage and being controlled by the output signal of the comparator,
   wherein in response to the output signal of the comparator having the first value, the pull-up device drives the voltage at the output node of the input gain stage to the second power supply voltage.

22. The current sense amplifier circuit of claim 5, further comprising:
   an eleventh transistor having a control terminal coupled to the output terminal of the comparator, a first current handling coupled to the output node of the input gain stage, and a second current handling terminal coupled to the second power supply voltage, wherein the eleventh transistor and the fourth transistor are of the same conductivity type.

23. The current sense amplifier circuit of claim 5, where in the current mirror further comprises:
   a first plurality of transistor pairs, each transistor pair including a first transistor and a second transistor being serially connected between the second node and the second power supply voltage, the control terminal of the first transistor of the transistor pair is coupled to the control terminal of the fourth transistor, and the control terminal of the second transistor of the transistor pair is coupled to receive a corresponding one of a plurality of select signals,
   wherein the first transistors in the plurality of transistor pairs are selectively turned on based on the plurality of select signals to provide the second current in conjunction with the fifth transistor.

24. The current sense amplifier circuit of claim 23, wherein the first transistors in the plurality of transistor pairs have different size ratios with respect to the fourth transistor.

25. The current sense amplifier circuit of claim 16, further comprising:
   a twelfth transistor having a control terminal coupled to receive the bias voltage, a first current handling terminal coupled to a fifth node and a second current handling terminal coupled to the first power supply voltage; and
   a thirteenth transistor having a control terminal coupled to receive a select signal, a first current handling terminal coupled to the third node and a second current handling terminal coupled to the fifth node,
   wherein the thirteenth transistor is selectively turned on based on the select signal to multiply the magnitude of the reference current.

26. The current sense amplifier circuit of claim 25, wherein the seventh transistor and the twelfth transistor have a first size ratio and the twelfth transistor conducts a current that is a multiple of the current conducted by the seventh transistor, the sum of the currents conducted by the seventh transistor and the twelfth transistor is the reference current.

27. The current sense amplifier circuit of claim 19, wherein the eighth, ninth and tenth transistors are oversized to increase the matching of the transistors.

28. The current sense amplifier circuit of claim 27, wherein the reference current is increased in accordance with the size of the eighth, ninth and tenth transistors.

29. The current sense amplifier circuit of claim 27, further comprising:
   a resistor coupled between the third node and a sixth node;
   a first MOS capacitor including a gate terminal coupled to the sixth node and first and second current handling terminals coupled to the first current handling terminal of the first transistor; and
   a second MOS capacitor including a gate terminal coupled to the first current handling terminal of the first transistor and first and second current handling terminals coupled to the sixth node,
   wherein the resistor and the first and second MOS capacitors provide frequency compensation.

30. The current sense amplifier circuit of claim 1, wherein the current mirror comprises:
   a fourth transistor having a control terminal coupled to a seventh node, a first current handling terminal coupled to the output node of the input gain stage and receiving the input current, and a second current handling terminal coupled to a second power supply voltage;
   a fifth transistor having a control terminal coupled to the seventh node, a first current handling terminal coupled to a second node and providing the second current, and a second current handling terminal coupled to the second power supply voltage;
   a fourteenth transistor having a control terminal coupled to the output node of the input gain stage, a first current handling terminal coupled to a fourth current mirror, and a second current handling terminal coupled to the second power supply voltage; and
   a fifteenth transistor having a control terminal and a first current handling terminal coupled to the seventh node and to an output node of the fourth current mirror, and a second current handling terminal coupled to the second power supply voltage.

31. The current sense amplifier circuit of claim 30, wherein the fourteenth transistor is turned on when an input current flows in the input gain stage and conducts a third current into the fourth current mirror, the fourth current mirror provides a fourth current at the output node driving the fifteenth transistor, the fourth transistor mirrors the fourth current flowing in the fifteenth transistor into the output node of the input gain stage, and the fifth transistor mirrors the current flowing in the fourth transistor into the second node.

32. The current sense amplifier circuit of claim 30, wherein the fourth current mirror comprises:
   a sixteenth transistor having a control terminal and a first current handling terminal coupled to the first current handling terminal of the fourteenth transistor, and a second current handling terminal coupled to a first power supply voltage; and
   a seventeenth transistor having a control terminal coupled to the control terminal of the sixteenth transistor, a first current handling terminal coupled to the seventh node and a second current handling terminal coupled to a first power supply voltage.

33. The current sense amplifier circuit of claim 30, wherein the current mirror further comprising:
 a resistor coupled between the seventh node and an eighth node; and
 a third capacitor coupled between the eighth node and the output node of the input gain stage,
 wherein the resistor and the third capacitor provide frequency compensation.

34. The current sense amplifier circuit of claim 30, further comprising:
 a first pull-up device coupled to the output node of the input gain stage and being controlled by the output signal of the comparator; and
 a second pull-up device coupled to the seventh node of the current mirror and being controlled by the output signal of the comparator,
 wherein in response to the output signal of the comparator having the first value, the first and second pull-up devices drives the voltage at the output node of the input gain stage and the seventh node, respectively, to the second power supply voltage.

35. The current sense amplifier circuit of claim 30, further comprising:
 an eleventh transistor having a control terminal coupled to the output terminal of the comparator, a first current handling coupled to the output node of the input gain stage, and a second current handling terminal coupled to the second power supply voltage, wherein the eleventh transistor and the fourth transistor are of the same conductivity type; and
 an eighteenth transistor having a control terminal coupled to the output terminal of the comparator, a first current handling coupled to the seventh node, and a second current handling terminal coupled to the second power supply voltage, wherein the eighteenth transistor and the fourth transistor are of the same conductivity type.

36. A method for sensing a first current flowing in a first node, comprising:
 coupling the first current to an input node of an input gain stage and providing the first current at an output node of the input gain stage;
 providing a feedback loop in the input gain stage to maintain a voltage at the input node at a substantially constant level;
 mirroring the first current into a second current;
 integrating charge associated with the second current at a second node;
 developing a first voltage at the second node as a result of integrating the charge associated with the second current;
 comparing the first voltage to a reference level;
 providing an output signal having a first value when the first voltage exceeds the reference level; and
 providing an output signal having a second value when the first voltage is less than the reference level.

37. The method of claim 36, wherein coupling the first current to an input node of an input gain stage comprises coupling the first current to an input node of a unity gain input gain stage.

38. The method of claim 36, further comprising:
 providing the output signal based on a clock signal;
 discharging the first voltage at the beginning of each clock cycle of the clock signal.

39. The method of claim 36, further comprising:
 in response to the output signal having the first value, driving a voltage at the output node of the input gain stage to a first power supply voltage.

40. The method of claim 36, wherein mirroring the first current into a second current comprises:
 in response to the first current being provided at the output node of the input gain stage, conducting a third current in a third node;
 mirroring the third current into a fourth current at a fourth node;
 providing a negative feedback loop to mirror the fourth current into the output node of the input gain stage; and
 mirroring the current flowing at the output node of the input gain stage into the second current.

41. The method of claim 40, further comprising:
 in response to the output signal having the first value, driving a voltage at the fourth node to a first power supply voltage.

* * * * *